(12) United States Patent
Kim et al.

(10) Patent No.: US 11,024,682 B2
(45) Date of Patent: Jun. 1, 2021

(54) FINGERPRINT SENSOR AND DISPLAY DEVICE INCLUDING THE SAME

(71) Applicant: SAMSUNG DISPLAY CO., LTD., Yongin-si (KR)

(72) Inventors: Il Nam Kim, Yongin-si (KR); Yun Ho Kim, Yongin-si (KR); Ji Hun Ryu, Yongin-si (KR); Eun Jin Sung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/688,512

(22) Filed: Nov. 19, 2019

(65) Prior Publication Data

US 2020/0219948 A1 Jul. 9, 2020

(30) Foreign Application Priority Data

Jan. 4, 2019 (KR) ........................ 10-2019-0001364

(51) Int. Cl.
*G09G 5/00* (2006.01)
*H01L 27/32* (2006.01)
*G06K 9/00* (2006.01)
*G09G 3/3266* (2016.01)
*G09G 3/3283* (2016.01)

(52) U.S. Cl.
CPC ........ *H01L 27/3234* (2013.01); *G06K 9/0004* (2013.01); *G09G 3/3266* (2013.01); *G09G 3/3283* (2013.01); *G09G 2310/0243* (2013.01)

(58) Field of Classification Search
CPC ............ H01L 27/3234; H01L 27/3244; G09G 3/3266; G09G 3/3283; G06K 9/0004; G06K 9/0002; G06K 9/0012; G06F 3/044
See application file for complete search history.

(56) References Cited

U.S. PATENT DOCUMENTS

| | | | |
|---|---|---|---|
| 10,268,884 B2 * | 4/2019 | Jones | G06F 1/1637 |
| 10,360,431 B2 * | 7/2019 | Gozzini | G06F 1/1626 |
| 10,437,974 B2 * | 10/2019 | He | G06K 9/00046 |
| 10,599,939 B2 | 3/2020 | Gu et al. | |
| 2017/0017824 A1 | 1/2017 | Smith et al. | |
| 2017/0220844 A1 | 8/2017 | Jones et al. | |
| 2018/0046837 A1 | 2/2018 | Gozzini et al. | |
| 2018/0129798 A1 * | 5/2018 | He | G06F 3/0412 |

(Continued)

FOREIGN PATENT DOCUMENTS

| | | |
|---|---|---|
| EP | 3306526 | 4/2018 |
| EP | 3467811 | 4/2019 |
| KR | 10-2018-0100140 | 9/2018 |

(Continued)

*Primary Examiner* — Vijay Shankar
(74) *Attorney, Agent, or Firm* — F. Chau & Associates, LLC

(57) ABSTRACT

The fingerprint sensor may include: a light transmitting hole array layer including a plurality of light blocking patterns having a plurality of light transmitting holes to form light transmitting paths of light rays; a sensor layer including a plurality of photo sensors configured to sense light rays that pass through the light transmitting holes and are incident on the sensor layer; and metal patterns configured to apply electrical signals to pixels or the light blocking patterns. A gap between the light blocking patterns may overlap with at least some of the metal patterns.

19 Claims, 15 Drawing Sheets

(56) References Cited

U.S. PATENT DOCUMENTS

2020/0104562 A1   4/2020   Sung et al.
2020/0127066 A1   4/2020   Zhang et al.

FOREIGN PATENT DOCUMENTS

| KR | 10-2020-0038388 | 4/2020 |
| WO | 2017206676 | 12/2017 |
| WO | 2018214481 | 11/2018 |

* cited by examiner

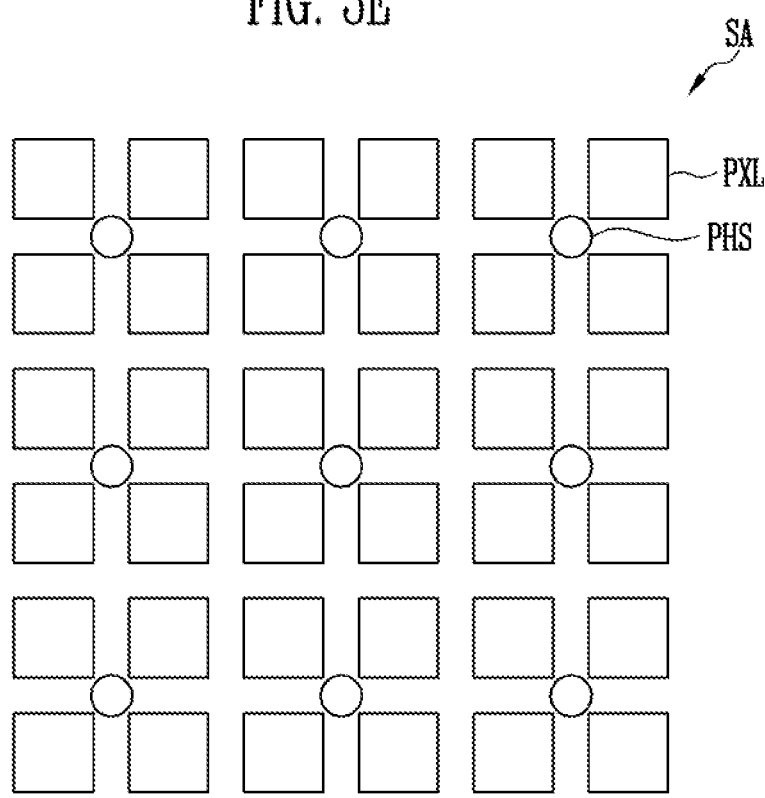

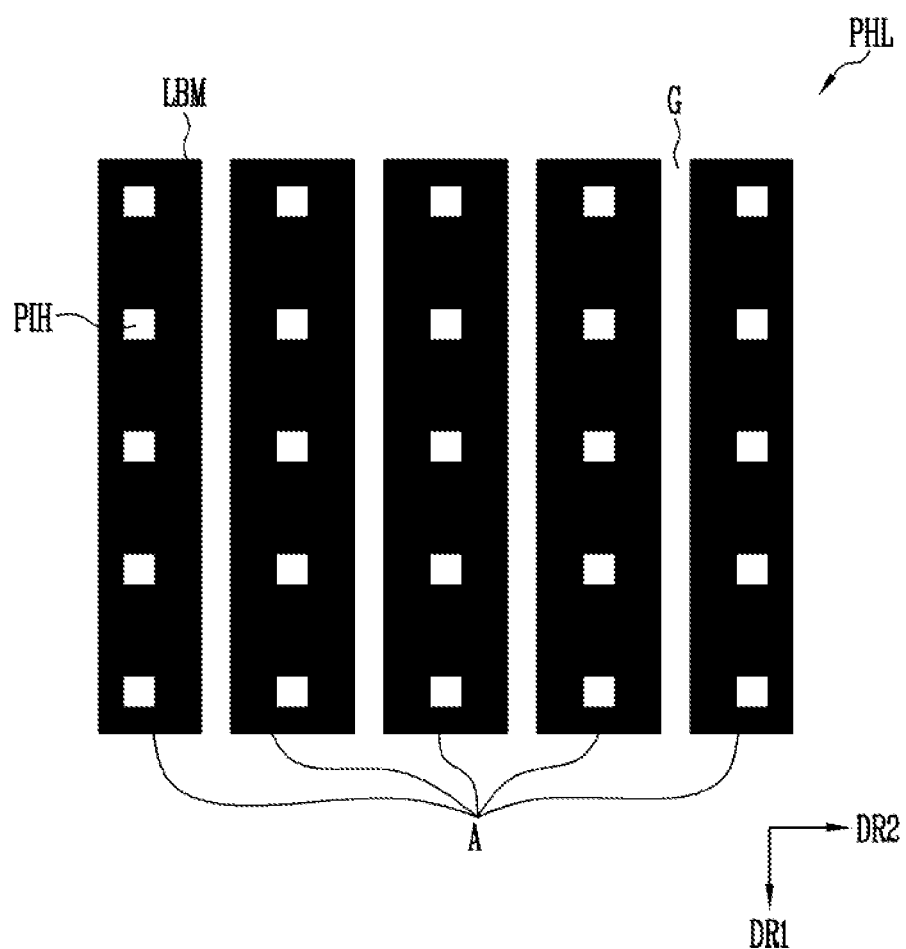

FINGERPRINT SENSOR AND DISPLAY DEVICE INCLUDING THE SAME

CROSS-REFERENCE TO RELATED APPLICATION

The present application claims priority to Korean patent application number no. 10-2019-0001364 filed on Jan. 4, 2019, the disclosure of which is incorporated by reference herein in its entirety.

TECHNICAL FIELD

Exemplary embodiments of the inventive concept relate to a fingerprint sensor and a display device including the fingerprint sensor.

DISCUSSION OF RELATED ART

Recently, as mobile display devices such as smartphones and tablets are more commonly used in various ways and maybe more easily misplaced or lost, effective authentication methods are needed to protect data including personal information stored in the mobile devices, Biometric information authentication methods using a fingerprint recognition or the like are gaining in use. To provide a fingerprint sensing function, a fingerprint sensor may be provided in a display device in such a way that the fingerprint sensor is installed or mounted to the display device.

For example, the fingerprint sensor may be configured as a photo-sensing type sensor. The photo-sensing fingerprint sensor may include a light source, a lens, and an optical sensor array. When a fingerprint sensing operation is performed in some portion of the display device, as the intensity of light emitted from a light source is increased, the fingerprint sensing accuracy is increased. However, in this case, since the luminance of an image displayed on a display panel varies, the quality of the image may be reduced.

SUMMARY

Exemplary embodiments of the inventive concept are directed to a fingerprint sensor capable of improving accuracy in fingerprint sensing without deteriorating the quality of an image, and a display device including the fingerprint sensor.

Exemplary embodiments of the inventive concept are directed to a fingerprint sensor and a display device including the fingerprint sensor which may increase the quantity of light emitted from light emitting elements using a change in characteristics of transistors in pixels by a bias voltage applied to a pinhole array layer, and may sense the fingerprint of a user using reflected light rays obtained from light emitted from the light emitting elements.

Exemplary embodiments of the inventive concept are directed to a fingerprint sensor and a display device including the fingerprint sensor which employs a pinhole array layer including a plurality of light blocking patterns so that a bias voltage applying operation and a fingerprint sensing operation may be performed only on a specific light blocking pattern on the display device.

Exemplary embodiments of the inventive concept are directed to a fingerprint sensor and a display device including the fingerprint sensor in which a light blocking metal pattern is disposed over a gap between divided light blocking patterns of the pinhole array layer, thus providing an effective light blocking function.

An exemplary embodiment of the inventive concept may provide a fingerprint sensor including: a light transmitting hole array layer including a plurality of light blocking patterns having a plurality of light transmitting holes to form light transmitting paths of light rays; a sensor layer including a plurality of photo sensors configured to sense light rays that pass through the light transmitting holes and are incident on the sensor layer; and metal patterns configured to apply electrical signals to pixels or the light blocking patterns. A gap between the light blocking patterns may overlap with at least some of the metal patterns.

In an exemplary embodiment, the fingerprint sensor may further include a circuit element layer on which at least one circuit element that forms each of the pixels is formed. The metal patterns may include lines formed on the circuit element layer.

In an exemplary embodiment, the metal patterns may include at least one kind of lines among scan lines configured to supply scan signals to the pixels, data lines configured to supply data signals to the pixels, emission control lines configured to supply emission control signals to the pixels, and power lines configured to apply driving power to the pixels.

In an exemplary embodiment, the fingerprint sensor may further include a contact layer configured to apply power to the light blocking patterns. The metal patterns may include lines formed on the contact layer.

In an exemplary embodiment, the contact layer may be electrically coupled to the light blocking patterns through one or more contact holes and selectively apply a bias voltage to at least one of the light blocking patterns.

In an exemplary embodiment, each of the pixels may include at least one transistor, and the at least one transistor may change in threshold voltage thereof as the bias voltage is selectively applied to the at least one of the light blocking patterns.

In an exemplary embodiment, each of the pixels may include a light emitting element. As the bias voltage is selectively applied to the at least one of the light blocking patterns, current passing through the light emitting element may be controlled.

In an exemplary embodiment, the bias voltage may be a positive voltage.

In an exemplary embodiment, the light transmitting hole array layer may include a plurality of light blocking patterns extending in a first direction and arranged in a second direction perpendicular to the first direction.

In an exemplary embodiment, the light transmitting hole array layer may include the plurality of light blocking patterns arranged in a first direction and a second direction perpendicular to the first direction.

In an exemplary embodiment, the fingerprint sensor may further include: a circuit element layer on which at least one circuit element forming each of the pixels is provided; and a contact layer configured to apply power to the light blocking patterns. The metal patterns may include: first metal patterns including lines formed on the circuit element layer; and second metal patterns including lines formed on the contact layer.

In an exemplary embodiment, first directional gaps of the gaps between the light blocking patterns may overlap with the first metal patterns, and second directional gaps of the gaps may overlap with the second metal patterns.

In an exemplary embodiment, the metal patterns may block light rays that are incident into the gaps between the light blocking patterns.

Exemplary embodiments of the inventive concept may provide a display device including: a display panel including pixels and a light transmitting hole array layer including a plurality of light blocking patterns having a plurality of light transmitting holes; a sensor layer formed on one surface of the display panel and including a plurality of photo sensors configured to sense light rays that are incident through the display panel; and metal patterns configured to apply electrical signals to the pixels or the light blocking patterns. A gap between the light blocking patterns may overlap with at least some of the metal patterns.

In an exemplary embodiment, the display panel may include a circuit element layer on which at least one circuit element that forms each of the pixels is formed. The metal patterns may include lines formed on the circuit element layer.

In an exemplary embodiment, the metal patterns may include at least one kind of lines among scan lines configured to supply scan signals to the pixels, data.

lines configured to supply data signals to the pixels, emission control lines configured to supply emission control signals to the pixels, and power lines configured to apply driving power to the pixels.

In an exemplary embodiment, the display panel may include a contact layer configured to apply power to the light blocking patterns. The metal patterns may include lines formed on the contact layer.

In an exemplary embodiment, the contact layer may be electrically coupled to the light blocking patterns through one or more contact holes and selectively apply a bias voltage to at least one of the light blocking patterns.

In an exemplary embodiment, the light transmitting hole array layer may include a plurality of light blocking patterns extending in a first direction and arranged in a second direction perpendicular to the first direction.

In an exemplary embodiment, the light transmitting hole array layer may include the plurality of light blocking patterns arranged in a first direction and a second direction perpendicular to the first direction.

In an exemplary embodiment, the display panel may include: a circuit element layer on which at least one circuit element forming each of the pixels is provided; and a contact layer configured to apply power to the light blocking patterns. The metal patterns may include: first metal patterns including lines formed on the circuit element layer; and second metal patterns including lines formed on the contact layer.

In an exemplary embodiment, first directional gaps of the gaps between the light blocking patterns may overlap with the first metal patterns, and second directional gaps of the gaps may overlap with the second metal patterns.

In an exemplary embodiment, the metal patterns may block light rays that are incident into the gaps between the light blocking patterns.

According to an exemplary embodiment of the inventive concept, a display device includes pixels coupled to scan lines and data lines, first through nth scan drivers configured to supply scan signals to the pixels through the scan lines, a data driver configured to supply data signals and a bias signal to the pixels through the data lines, and a timing controller configured to supply image data and bias data to the data driver, and to sequentially supply first through nth start signals to the first through nth scan drivers, respectively. The pixels are supplied with the data signals when the scan signals are supplied during display periods, and are supplied with the bias signal when the scan signals are supplied during a bias period between the display periods, and n is a natural number greater than one.

BRIEF DESCRIPTION OF THE DRAWINGS

The above and other features of the inventive concept will be more clearly understood by describing in detail exemplary embodiments thereof with reference to the accompanying drawings.

FIGS. 3A to 3E are plan views illustrating exemplary embodiments of an arrangement structure of pixels and photo sensors in accordance with embodiments of the inventive concept.

FIGS. 7A and 7B are plan views illustrating an exemplary embodiment of a pinhole array layer of FIG. 6.

DETAILED DESCRIPTION WITH EXEMPLARY EMBODIMENTS

Figure 1:
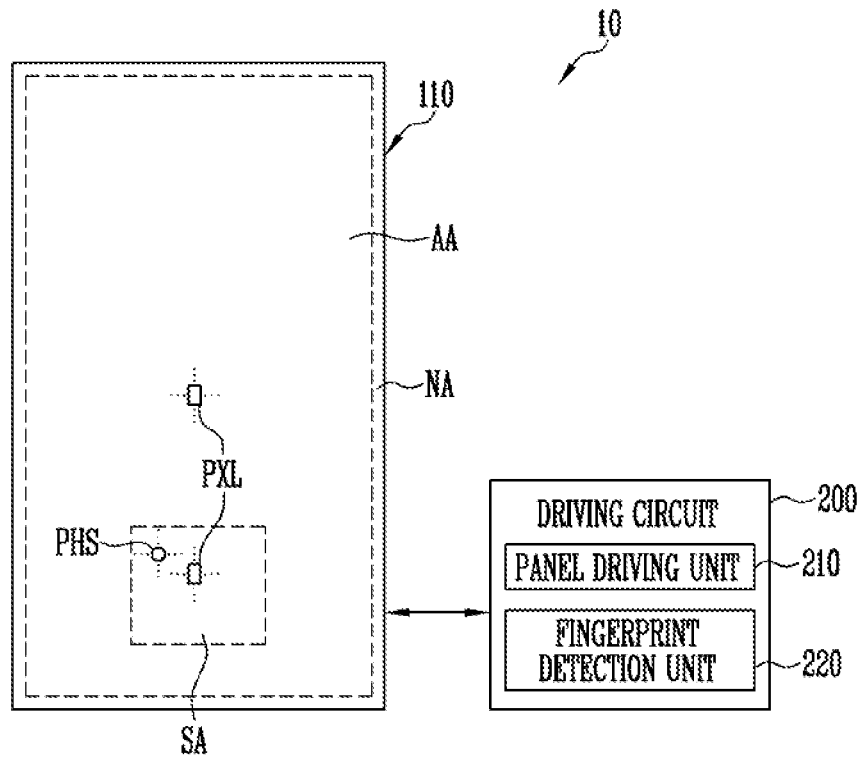
FIGS. 1 and 2 are plan views schematically illustrating a display device in accordance with an exemplary embodiment of the inventive concept.

Exemplary embodiments of the inventive concept provide a display device for initializing a threshold voltage characteristic of a driving transistor by applying an on-bias voltage to the driving transistor during a vertical blank period, and a driving method of the display device.

In the entire specification, when an element is referred to as being "connected" or "coupled" to another element, it can be directly connected or coupled to the another element or be indirectly connected or coupled to the another element with one or more intervening elements interposed therebetween. It will also be understood that when an element is referred to as being "between" two elements, it can be the only element between the two elements, or one or more intervening elements may also be present.

Exemplary embodiments of the inventive concept will be described more fully hereinafter with reference to the accompanying drawings. Like reference numerals may refer to like elements throughout this application.

Figure 2:
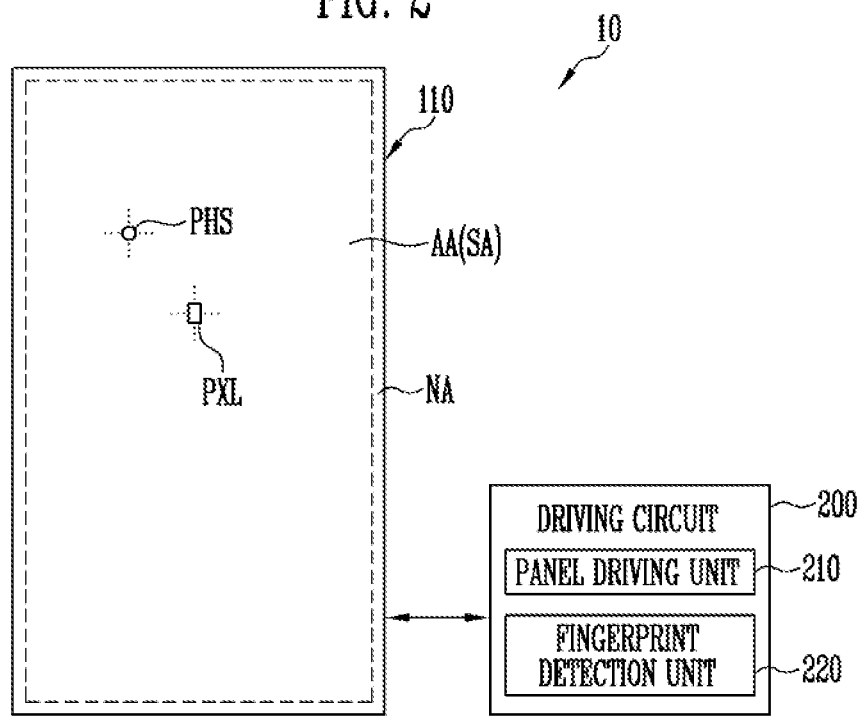

FIGS. 1 and 2 are diagrams schematically illustrating a display device 10 in accordance with an exemplary embodiment of the inventive concept. In detail, FIGS. 1 and 2 are diagrams schematically illustrating a display panel 110 and a driving circuit 200 for driving the display panel 110 that are provided in the display device 10 in accordance with an exemplary embodiment of the inventive concept. For the sake of description, although FIGS. 1 and 2 illustrate that the display panel 110 and the driving circuit 200 are separately provided, the inventive concept is not limited thereto. For example, the entirety or portion of the driving circuit 200 may be integrally formed on the display panel 110.

Referring to FIGS. 1 and 2, the display device 10 may include the display panel 110 and the driving circuit 200 configured to drive the display panel 110.

The display panel 110 includes a display area AA and a non-display area NA. The display area AA is an area in which a plurality of pixels PXL are provided, and may be referred to as an active area. In exemplary embodiments, each of the pixels PXL may include at least one light emitting element. The display device 10 may drive pixels PXL m response to image data input from an external device, thus displaying an image on the display area AA.

In exemplary embodiments of the inventive concept, the display area AA may include a sensing area SA. The sensing area SA may include at least some of the pixels PXL provided in the display area AA.

In an exemplary embodiment, as illustrated in FIG. 1, at least a portion of the display area AA may be set as the sensing area SA. In an exemplary embodiment, as illustrated in FIG. 2, the entirety of the display area AA may be set as the sensing area SA.

Although FIG. 1 illustrates an example where only one sensing area SA is formed on the display area AA, the technical spirit of the inventive concept is not limited thereto. In other words, in exemplary embodiments, a plurality of sensing areas SA arranged in a regular or irregular pattern may be formed on the display area AA. In these exemplary embodiments, the plurality of sensing areas SA may have identical or different surface areas and shapes.

Although FIG. 1 illustrates an example where the sensing area SA is formed in at least a portion of the display area AA, the technical spirit of the inventive concept is not limited thereto, in other words, in exemplary embodiments, the display area AA and the sensing area SA may be provided to overlap with each other in only some area.

The non-display area NA is an area which is disposed around the display area AA, and may be referred to as a non-active area. In exemplary embodiments, the non-display area NA may mean the other area of the display panel 110 excluding the display area AA. In an exemplary embodiment, the display area. NA may include, for example, a line area, a pad area, and various dummy areas.

In exemplary embodiments of the inventive concept, the display device 10 may further include a plurality of photo sensors PHS provided in the sensing area SA. In an exemplary embodiment, the photo sensors PHS may sense rays of light that are reflected by the finger of a user after being emitted from a light source, and analyze the rays of reflected light to sense the fingerprint of the user. Although hereinafter the photo sensors PHS will be described as being used for fingerprint sensing by way of example, the photo sensors PHS may be used for a variety of purposes to perform various functions, e.g., as a touch sensor and a scanner.

In exemplary embodiments of the inventive concept, the photo sensors PHS may be disposed on the sensing area SA. Here, the photo sensors PHS may overlap with at least some or all of the pixels PXL provided on the sensing area SA, or may be disposed around the pixels PXL. For example, at least some or all of the photo sensors PHS may be provided between the pixels PXL. Exemplary embodiments of the arrangement relationship between the photo sensors PHS and the pixels PXL will be described in more detail with reference to FIGS. 3A to 3E.

In an exemplary embodiment in which the photo sensors PHS are provided adjacent to the pixels PXL, the photo sensors PHS may use, as a light source, a light emitting element provided in at least one pixel PXL which is disposed in or around the sensing area SA. In this exemplary embodiment, the photo sensors PHS, along with the pixels PXL of the sensing area SA, along with light emitting elements provided in the pixels PXL, may form a photo-sensing type fingerprint sensor. As such, in the ease where the fingerprint sensor embedded display device is configured using the pixels PXL as the light source without using a separate external light source, the thicknesses of the photo-sensing type fingerprint sensor and a module of the display device that includes the fingerprint sensor may be reduced, and the production cost may also be reduced.

In exemplary embodiments, the photo sensors PHS may be disposed both on an image display surface (e.g., a front surface) of opposite surfaces of the display panel 110, and on the other surface (e.g., a rear surface) facing away the front surface. However, the inventive concept is not limited thereto.

In exemplary embodiments of the inventive concept, the display device PHS may further include an optical system for configuring the photo-sensing type fingerprint sensor along with the photo sensors PHS. In these exemplary embodiments, at least a portion of the optical system may be formed integrally with the display panel 110. For example, the display panel 110 may be an optical-system-integrated display panel including a pinhole array layer.

The driving circuit 200 may drive the display panel 110, For example, the driving circuit 200 may output a data signal corresponding to image data to the display panel 110, or may output driving signals for the photo sensors PHS and receive sensing signals from the photo sensors PHS. The driving circuit 200 that has received the sensing signals may detect a shape of the fingerprint of the user using the sensing signals.

In exemplary embodiments of the inventive concept, the driving circuit 200 may include a panel driving unit 210 and a fingerprint detection unit 220. In some examples, fingerprint detection 220 unit may detect fingerprints which may then be analyzed based on features called minutiae (i.e., fingerprint features including points where fingerprint ridges join, split or terminate). For example, a processor of the display device 10 may measure distances and angles between the minutiae and then transform the information about the minutiae and the relationships between them into a unique code corresponding to a particular fingerprint. This code may then be used to identify or authenticate a user.

According to embodiments of the present invention, a method of fingerprint detection may include identifying a location of a finger placed on or near a display area AA; selecting a portion of the display area AA corresponding to the location of the finger (which may be a portion of the sensing area SA); and applying a bias voltage to pixels PXL (or one or more patterns of a pinhole array) of the display device 10 corresponding to the selected portion of the display area AA.

In some examples, the method may include increasing a luminance of the portion of the display area AA where the finger is located (i.e., based on applying the bias voltage); blocking a first portion of reflected light from the fingers based at least in part on the increased luminance, where the first portion of light is blocked using a light blocking pattern aligned with one or more gaps in the one or more patterns of the pinhole layer; sensing a second portion of light reflected from the finger using a sensor layer of the display device 10, where the second portion of light passes through pinholes in the one or more patterns of the pinhole layer; and detecting a fingerprint based on the second portion of light.

In other words, the pinhole array layer may be broken up into regions so that when a finger is placed near the display device 10, only that regions near the finger can be caused to have increased luminance. This can improve the accuracy of the fingerprint detection without impacting the display quality of the rest of the display area. If the linger is placed at another location, a different area can be selected for increased luminance.

Because the pinhole array layer is broken up into different portions (i.e., to have a bias voltage selectively applied to a subset of the regions based on the finger location), there may be gaps between the different regions (i.e., between different patterns in the pinhole array layer). Thus, according to various embodiments of the present disclosure, metal patterns in a layer other than that of the pinhole array layer may be aligned with the gaps. For example, the metal patterns may include power lines for the pixels, emission control lines, scan lines (as in FIGS. 9 and 10), data lines (as in FIGS. 11-12) contact layer patterns (as in FIGS. 15-16), or other metal patterns (as in FIGS. 17-18.

Although FIGS. 1 and 2 illustrate the panel driving unit 210 and the fingerprint detection unit 220 as being separately provided, the technical spirit of the inventive concept is not limited thereto. For instance, at least portion of the fingerprint detection unit 220 may be integrated with the panel driving unit 210 or interlock with the panel driving unit 210.

The panel driving unit 210 may successively scan the pixels PXL of the display area AA and supply data signals corresponding to image data to the pixels PXL. Thereby, the display panel 110 may display an image corresponding to the image data.

In an exemplary embodiment, the panel driving unit 210 may supply driving signals for fingerprint sensing to the pixels PXL. The driving signals may be provided to cause the pixels PXL to emit light and operate as light sources for the photo sensors PHS. In this exemplary embodiment, the driving signals for fingerprint sensing may be provided to pixels PXL provided in a specific area in the display panel 110, fix example, to the pixels PXL provided in the sensing area SA. In exemplary embodiments, the driving signals for fingerprint sensing may be provided by the fingerprint detection unit 220.

The fingerprint detection unit 220 may transmit driving signals for driving the photo sensors PHS to the photo sensors PHS, and detect the fingerprint of the user based on sensing signals received from the photo sensors PHS.

Embodiments of the present disclosure described how the fingerprint detection unit 220 may perform accurate fingerprint sensing without reducing the quality of images in the display area AA.

FIGS. 3A to 3E are plan views illustrating exemplary embodiments of an arrangement structure of the pixels PXL and the photo sensors PHS in accordance with embodiments of the inventive concept, FIGS. 3A to 3E illustrate different exemplary embodiments about relative sizes, resolutions, and arrangement relationship between at least one or more pixels PXL and photo sensors PHS which are provided in the sensing area SA.

Figure 3A:
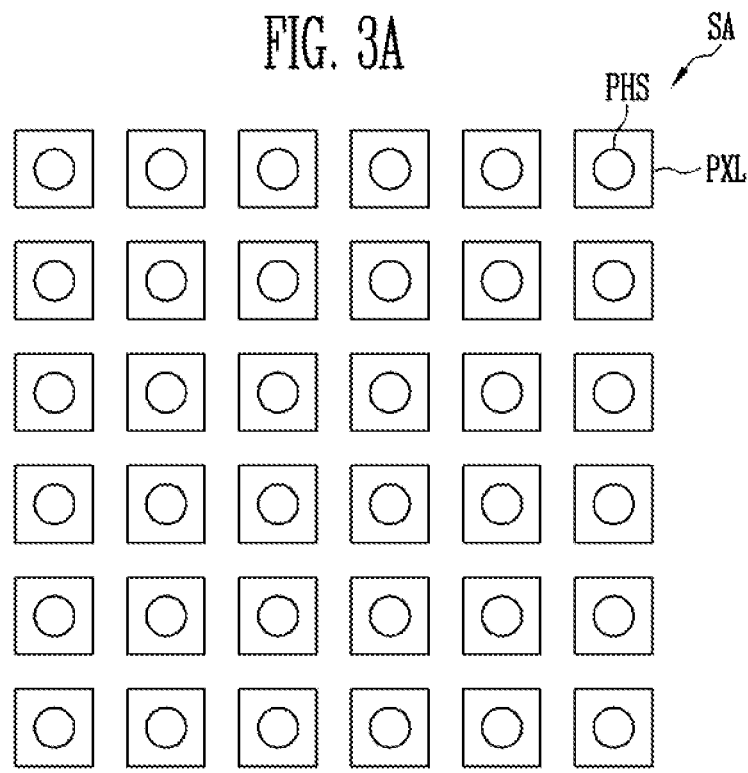

Referring to FIG. 3A, the photo sensors PHS may be disposed in the sensing area SA at the same resolution (or the same density) as that of the pixels PXL. In other words, the number of photo sensors PHS disposed in the sensing area SA may be the same as that of the pixels PXL. In this exemplary embodiment, the pixels PXL and the photo sensors PHS may be disposed to be paired one-to-one with each other. In the exemplary embodiment of FIG. 3A, the pixels PXL and the photo sensors PHS have been illustrated as overlapping with each other. However, in an exemplary embodiment, the pixels PXL and the photo sensors PHS may not overlap with each other, or may overlap with each other only in some area, Although in the exemplary embodiment of FIG. 3A each photo sensor PHS has been illustrated as having a size less than that of each pixel PXL, the technical spirit of the inventive concept is not limited thereto. For example, in an exemplary embodiment, each photo sensor PHS may have a size equal to or greater than that of each pixel PXL. This exemplary embodiment is illustrated in FIGS. 3C and 3D.

Referring to FIGS. 3B to 3E, the photo sensors PHS may be disposed in the sensing area SA at a resolution lower than that of the pixels PXL. In other words, the number of photo sensors PHS disposed in the sensing area SA may be less than that of the pixels PXL. Although FIGS. 3B to 3E illustrates an example in which one photo sensor PHS is disposed per four pixels PXL, the inventive concept is not limited thereto.

Figure 3B:
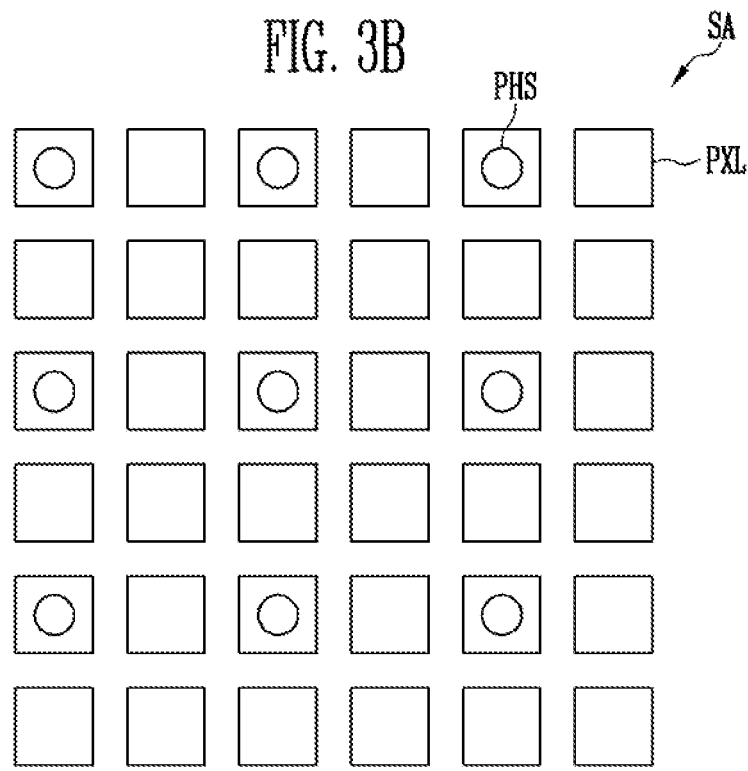
Figure 3C:
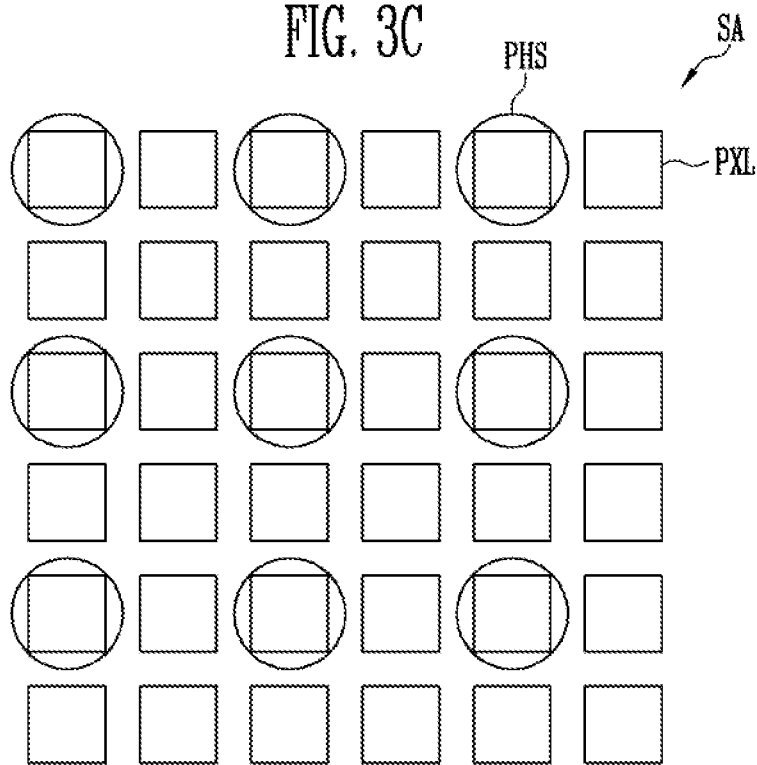
Figure 3D:
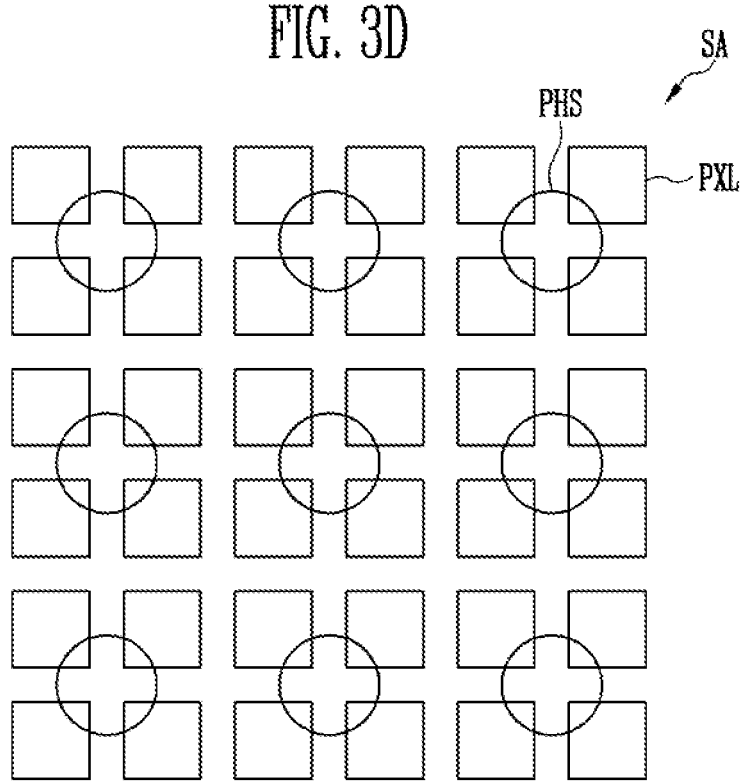

In this exemplary embodiment, as illustrated in FIGS. 3B and 3E, each photo sensor PHS may have a size less than that of each pixel PXL, or, as illustrated in FIGS. 3C and 3D, each photo sensor PHS may have a size greater than that of each pixel PXL. In the case there the photo sensors PHS are disposed at a resolution less than that of the pixels PXL, some or all of the photo sensors PHS may be disposed to overlap with the pixels PXL. In other words, as illustrated in FIGS. 3B and 3C, the photo sensors PHS may partially overlap with some of the pixels PXL.

Alternatively, as illustrated in FIG. 3D, the photo sensors PHS may be disposed between the pixels PXL and partially overlap with the pixels PXL. In this exemplary embodiment, as illustrated in FIG. 3D, each photo sensor PHS may have a size greater than that of each pixel PXL. For example, each photo sensor PHS may have a size appropriate to cover at least one pixel PXL.

Alternatively, as illustrated in FIG. 3E, the photo sensors PHS may not overlap with the pixels PXL.

In embodiments of the inventive concept, the arrangement structure between the pixels PXL and the photo sensors PHS is not limited to the above-mentioned arrangement structure. In other words, the shapes, the arrangement, the relative sizes, the numbers, the resolutions, etc. of the pixels PM, and the photo sensors PHS in the sensing area SA may be modified in various ways within the bounds of the technical spirit of the inventive concept. Furthermore, in exemplary embodiments, the pixels PXL and the photo sensors PHS may be disposed in the form of a combination of two or more of the exemplary embodiments of FIGS. 3A to 3E.

Figure 4:
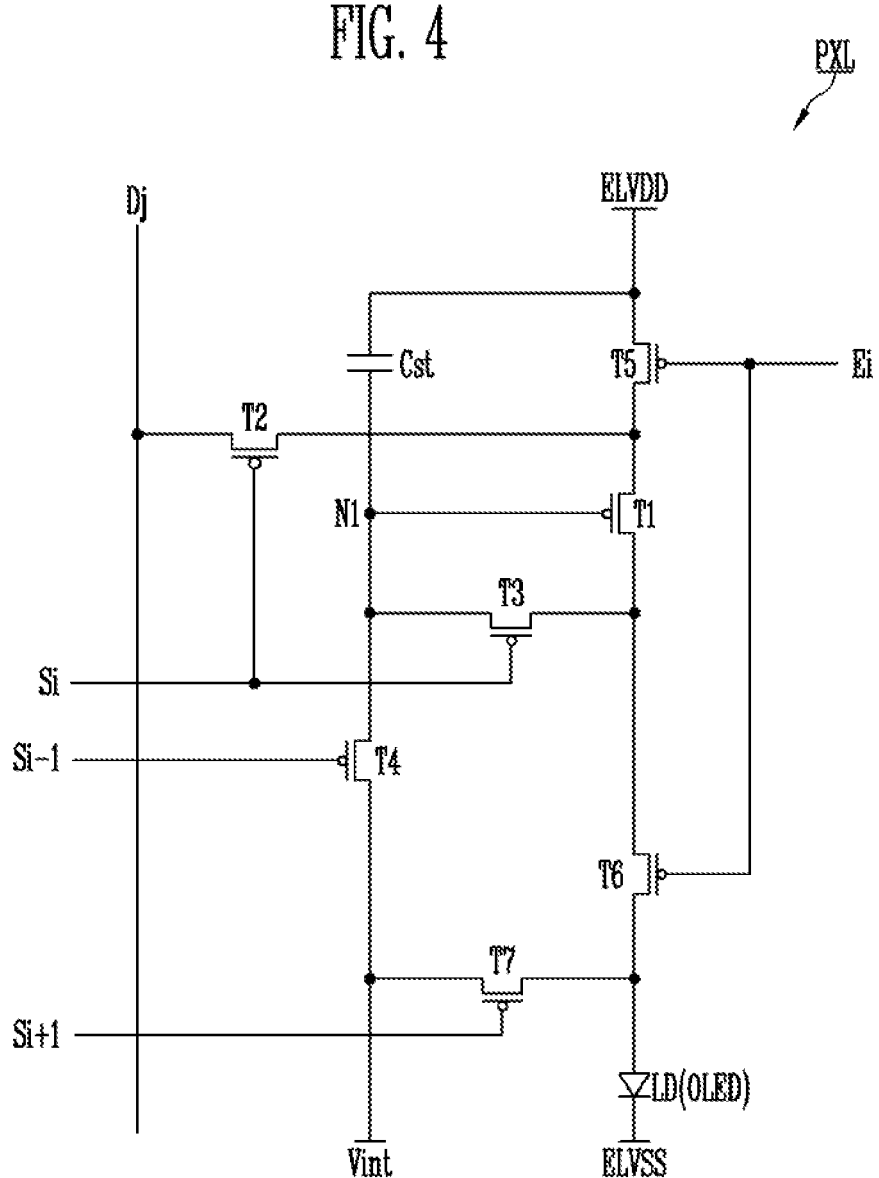
FIG. 4 is a circuit diagram illustrating an example of a pixel illustrated in FIGS. 1 to 3E.

In addition, although in FIGS. 3A to 3E the photo sensors PHS have been illustrated as being regularly arranged in the sensing area SA, the technical spirit of the inventive concept is not limited thereto. In exemplary embodiments, the photo sensors PHS may be irregularly arranged in the sensing area SA. In some embodiments, the number or density of photo sensors PHS may be greater that the number or density of pixels PXL. Although FIGS. 3A to 3E depict the horizontal placement of pixels PXL and photo sensors PHS, as shown below with reference to FIG. 6, the pixels PXL and photo sensors PHS may be vertically separated located in separate horizontal layers). FIG. 4 is a circuit diagram illustrating an example of a pixel PXL illustrated in FIGS. 1 to 3E. For the sake of description, FIG. 4 illustrates a pixel that is disposed both on an i-th scan line Si (i is a natural number) provided on an i-th horizontal pixel line and on a j-th data line Dj (j is a natural number) provided on a j-th vertical pixel line. However, the structure of the pixel PXL according to the inventive concept is not limited to that illustrated in FIG. 4.

Referring to IG. 4, the pixel PXL in accordance with an exemplary embodiment of the inventive concept may include a light emitting device LD, first to seventh transistors T1 to T7, and a storage capacitor Cst. In an exemplary embodiment, the light emitting device LD may be an organic light emitting diode (OLED), but the inventive concept is not limited thereto.

An anode electrode of the light emitting device LD may be coupled to the first transistor T1 via the sixth transistor T6, and a cathode electrode thereof may be coupled to the second power supply ELVSS. The light emitting device LD may emit light having a predetermined luminance corresponding to current supplied from the first transistor T1. The voltage of a first power supply ELVDD may be set to a value higher than the voltage of the second power supply ELVSS so as to allow current to flow to the light emitting device LD.

The seventh transistor 17 may be coupled between an initialization power supply Vint and a first electrode, e.g., the anode electrode, of the light emitting device LD. A gate electrode of the seventh transistor T7 may be coupled to an i+1-th scan line Si+1. When a scan signal of a gate-on voltage (e.g., a low level voltage) is supplied to the i+1-th scan line Si+1, the seventh transistor T7 is turned on so that the voltage of the initialization power supply Vint may be supplied to the anode electrode of the light emitting device LD. The voltage of the initialization power supply Vint may be set to a voltage lower than a data signal. In other words, the voltage of the initialization power supply Vint may be set to a minimum voltage of the data signal or less.

Although in the present exemplary embodiment the case where an anode initialization control line coupled with the gate electrode of the seventh transistor T7 is the i+1-th scan line Si-+1 is described by way of example, the inventive concept is not limited thereto. For example, in an exemplary embodiment of the inventive concept, the gate electrode of the seventh transistor T7 may be coupled to the i-th scan line Si. In this case, when a scan signal of a gate-on voltage is supplied to the i-th scan line Si, the voltage of the initialization power supply Vint may be supplied to the anode electrode of the light emitting device LD via the seventh transistor T7.

The sixth transistor T6 is coupled between the first transistor T1 and the light emitting device LD. A gate electrode of the sixth transistor T6 may be coupled to an i-th emission control line Ei. The sixth transistor T6 may be turned off when an emission control signal (e.g., a high level voltage) of a gate-off voltage is supplied to the i-th emission control line Ei, and may be turned on in the other cases.

The fifth transistor 15 may be coupled between the first power supply ELVDD and the first transistor T1. A gate electrode of the fifth transistor T5 may be coupled to the i-th emission control line Ei. The fifth transistor T5 may be turned off when an emission control signal of a gate-off voltage is supplied to the i-th emission is control line Ei, and may be turned on in the other cases.

A first electrode of the first transistor (T1; driving transistor) may be coupled to the first power supply ELVDD via the fifth transistor T5, and a second electrode thereof may be coupled to the anode electrode of the light emitting device LD via the sixth transistor T6. A gate electrode of the first transistor T1 may be coupled to a first node N1. The first transistor T1 may control, in response to a voltage of the first node N1, current flowing from the first power supply ELVEN) to the second power supply ELYSS via the light emitting device LD.

The third transistor T3 may be coupled between a second electrode of the first transistor T1 and the first node N1. A gate electrode of the third transistor T3 may be coupled to the i-th scan line Si. When a scan signal of a gate-on voltage is supplied to the i-th scan line Si, the third transistor T3 may be turned on to electrically connect the second electrode of the first transistor T1 to the first node N1. Therefore, when the third transistor T3 is turned on, the first transistor T1 may be connected in the form of a diode.

The fourth transistor T4 may be coupled between the first node N1 and the initialization power supply Vint. A gate electrode of the fourth transistor T4 may be coupled to the i-1-th scan line Si-1. When a scan signal is supplied to the i-1-th scan line Si-1, the fourth transistor T4 is turned on so that the voltage of the power supply Vint may be supplied to the first node N1. In the present exemplary embodiment, the i-1-th scan line Si-1 may be used as an initialization control line to initialize a gate node, the first node N1, of the first transistor T1. However, the inventive concept is not limited thereto. For example, in an exemplary embodiment, other control lines, e.g., a i-2-th scan line Si-2, may be used as the initialization control line to initialize the gate node of the first transistor T1.

The second transistor T2 may be coupled between the j-th data line Dj and the first electrode of the first transistor T1. A gate electrode of the second transistor T2 may be coupled to the i-th scan line Si. When a scan signal is supplied to the i-th scan line Si, the second transistor 12 may be turned on so that the first electrode of the first transistor T1 may be electrically coupled with the j-th data line Dj.

The storage capacitor Cst may be coupled between the first power supply ELVDD and the first node N1. The storage capacitor Cst may store a voltage corresponding both to a data signal and the threshold voltage of the first transistor T1.

The structure of the pixel PXL is not limited to the exemplary embodiment illustrated in FIG. 4. For example, various pixel circuits having known structures may be applied to the pixel PXL.

Figure 5:
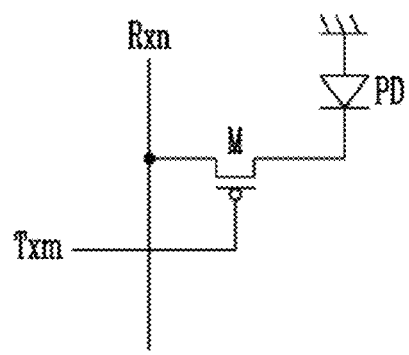
FIG. 5 is a circuit diagram illustrating an example of a photo sensor illustrated in FIGS. 1 to 3E.

FIG. 5 is a circuit diagram illustrating an example of a photo sensor PHS illustrated in FIGS. 1 to 3E. For the sake of description, FIG. 5 illustrates only a photo sensor PHS that is coupled to an m-th horizontal sensing line Txm (m is a natural number) and an n-th vertical sensing line Rxn is a natural number). In exemplary embodiments, the horizontal sensing line and the vertical sensing line may be oriented in a way different from that illustrated in FIG. 5. In these exemplary embodiments, elements constituting the photo sensor PHS may also be oriented in corresponding directions.

Referring to FIG. 5, the photo sensor PHS in accordance with an exemplary embodiment of the inventive concept may include a photo diode PD and a transistor M.

The photo diode PD may be configured to convert light energy into electric energy by generating a photoelectromotive force of changing current depending on the intensity of incident light.

The transistor M is coupled between an n-th vertical sensing line RXn and the photo diode PD. A gate electrode of the transistor M is coupled to an m-th horizontal sensing line Txm. The transistor M is turned on when a driving signal having a gate-on voltage (e.g., a low voltage) is supplied to the m-th horizontal sensing line Txm. If the transistor M is turned on, current flowing through the photo diode PD may flow to the nth vertical sensing line RXn.

The display device 10 may apply driving signals to the horizontal sensing lines coupled to the photo sensors PHS, and sense the fingerprint of the user based on current (hereinafter, referred to as sensing signals) supplied to the vertical sensing lines.

Figure 6:
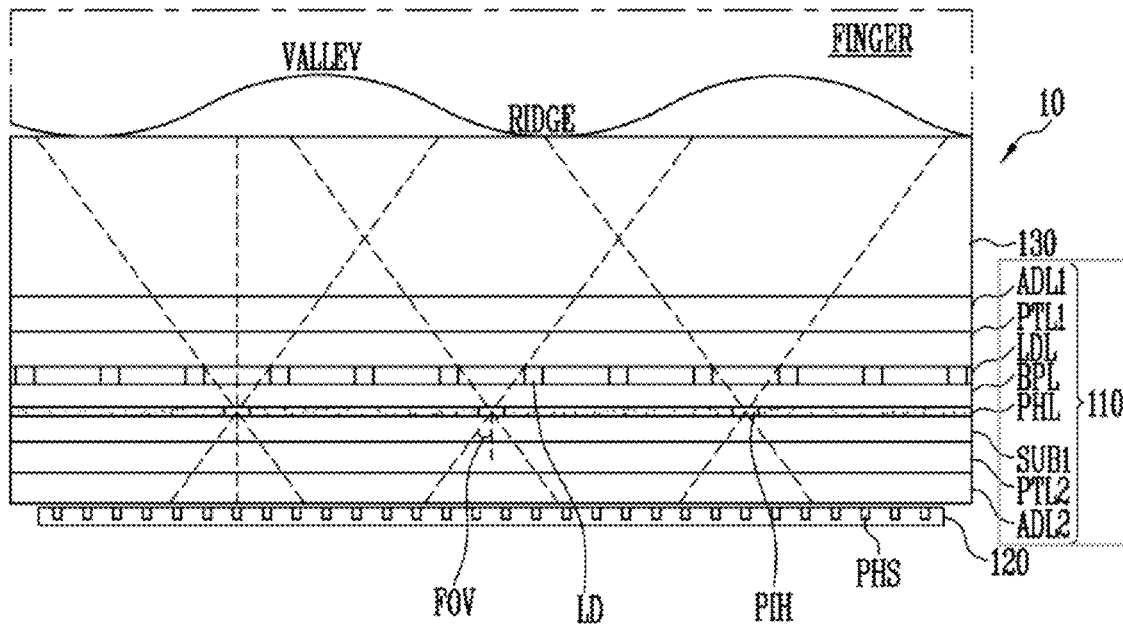
FIG. 6 is a sectional view of a display device in accordance with an exemplary embodiment of the inventive concept.
Figure 7A:
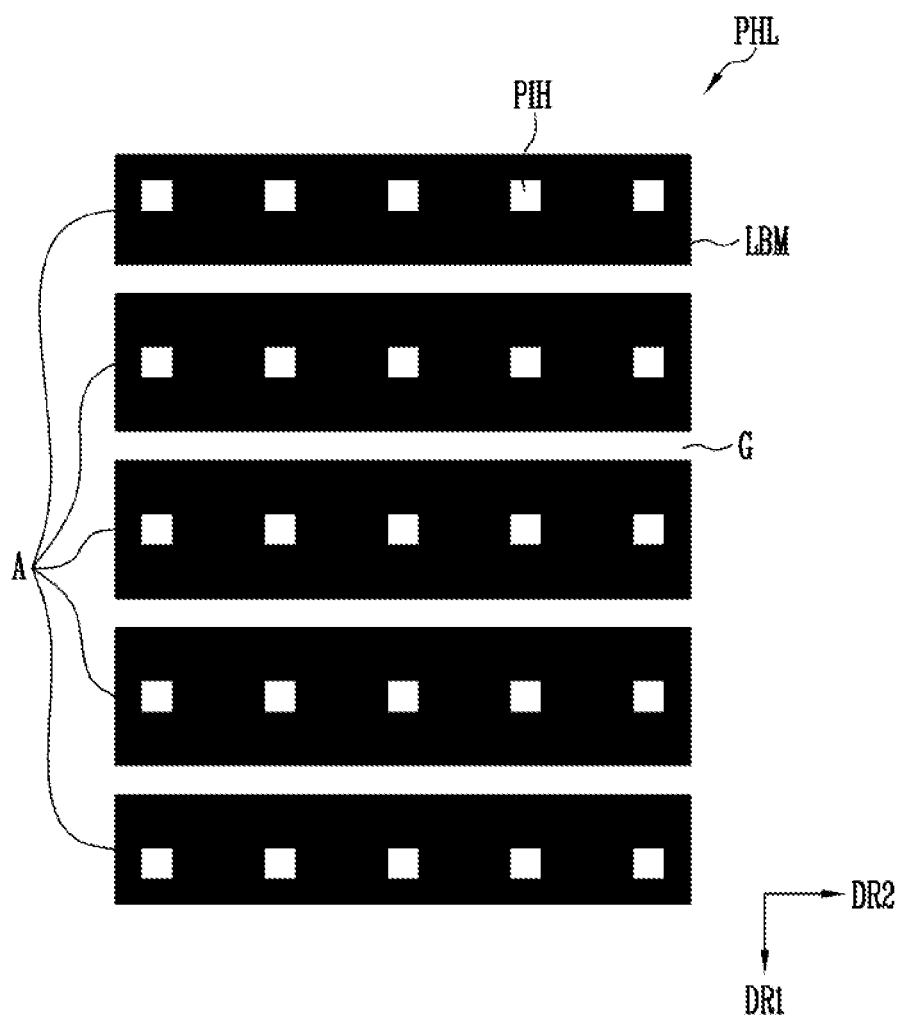
Figure 8:
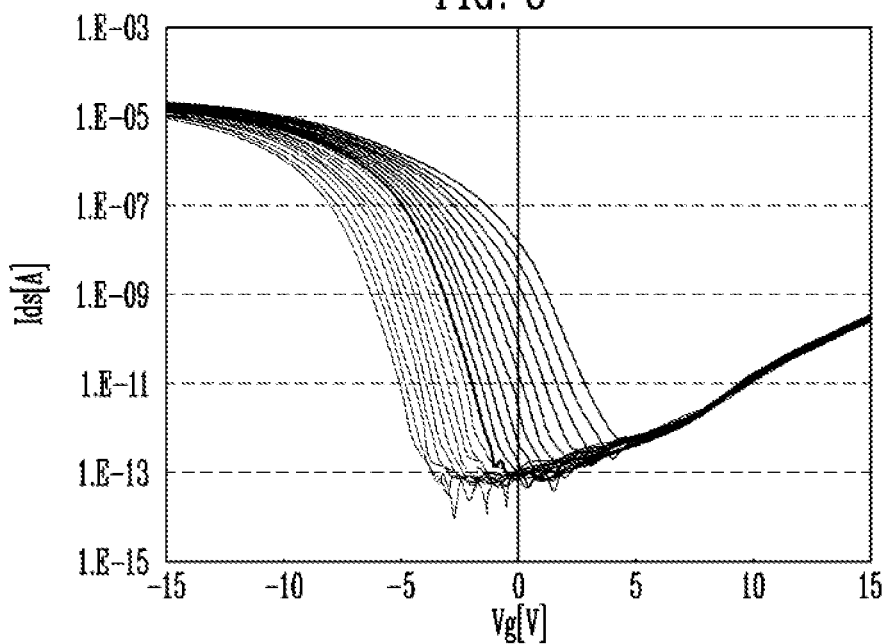
FIG. 8 is a graph for describing changes in characteristics of a transistor in a circuit element layer caused by a bias voltage applied to a pinhole array layer of FIG. 6.

FIG. 6 is a sectional view of the display device 10 in accordance with an exemplary embodiment of the inventive concept. FIGS. 7A and 7B are plan views illustrating exemplary embodiments of a pinhole array layer PHL of FIG. 6. FIG. 8 is a graph for describing changes in characteristics of a transistor in a circuit element layer BPL caused by a bias voltage applied to the pinhole array layer PHL of FIG. 6.

Referring to FIG. 6, the display device 10 in accordance with an exemplary embodiment of the inventive concept may include a display panel 110 including a plurality of pixels PXL, a sensor layer 120 provided on one surface of the display panel 110, and a window 130 provided on the other surface of the display panel 110. Specifically, FIG. 6 shows a cross section of a display device 10 on which a finger has been pressed to perform a fingerprint detection operation. The finger may include ridges and valleys in a unique pattern that enables the fingerprint to be recognized by the display device.

The display panel 110 may include a first substrate SUB1, and a circuit element layer BPL, a light emitting element layer LDL, a first protective layer PTL1 and a first adhesive layer ADL1 which are successively disposed on a first surface (e.g., an upper surface) of the first substrate SUB1.

The first substrate SUB1 may be a base substrate of the display panel 110 and be formed of a substantially transparent light transmitting substrate. In exemplary embodiments, the first substrate SUB1 may be a thin film substrate formed of polyimide (PI). In an exemplary embodiment, the first substrate SUB1 may be formed of a rigid substrate including glass or tempered glass, or a flexible substrate made of plastic. However, the material of the first substrate SUB1 is not limited thereto, and the first substrate SUB1 may be formed of various materials. In exemplary embodiments of the inventive concept, the first substrate SUB1 may include a display area AA and a non-display area NA, as illustrated in FIGS. 1 and 2.

The circuit element layer BPL may be disposed on the first surface of the first substrate SUB1, and may include at least one conductive layer. For example, the circuit element layer BPL may include a plurality of circuit elements which constitute a pixel circuit of each pixel PXL, and lines, e.g., a scan line, a data line, an emission control line, and a power line, configured to supply power and signals for driving the pixels PXL. In this exemplary embodiment, the circuit element layer BPL may include circuit elements such as a transistor and a capacitor, and a plurality of conductive layers provided to form lines connected to the circuit elements.

The light emitting element layer LDL may be disposed on the circuit element layer BPL. In exemplary embodiments, the light emitting element layer LDL may include a plurality of light emitting elements LD which are coupled to the circuit elements and/or the lines of the circuit element layer BPL through contact holes or the like. Such light emitting elements LD may form each pixel PXL.

In these exemplary embodiments, each of the pixels PXL may be formed of circuit elements provided in the circuit element layer BPL, and a light emitting element LD provided in the light emitting element layer LDL.

The first protective layer PTL1 may be disposed on the light emitting element layer LDL to cover the entirety or portion of the display panel 110, for example, to cover the display area AA. In exemplary embodiments, the first protective layer PTL1 may include a thin film encapsulation (TFE) layer or a sealing member such as an encapsulation substrate. The first protective layer PTL1 may further include a protective film or the like.

The first, adhesive layer ADL1 may be disposed between the first protective layer PTL1 and the window 130 and couple the first protective layer PTL1 with the window 130. In exemplary embodiments, the first adhesive layer ADL1 may include a transparent adhesive such as an optical clear adhesive (OCA), but the adhesive material is not limited thereto.

In exemplary embodiments, the display panel 110 may further include a second protective layer PTL2 and a second adhesive layer ADL2 which are successively disposed on a second surface (e.g., a lower surface) of the first substrate SUB1.

The second protective layer PTL2 may be disposed on the second layer of the first substrate SUB1 and include at least one film layer such as a protective film layer.

The second adhesive layer ADL2 may be disposed between the second protective layer PTL2 and the sensor layer 120 and couple the second protective layer PTL2 with the sensor layer 120. Although the second adhesive layer ADL2 may include a transparent adhesive such as an OCA, the adhesive material is not limited thereto.

In exemplary embodiments of the inventive concept, the display panel 110 may further include a pinhole array layer PHL (i.e., a light transmitting hole array layer). In an exemplary embodiment, the pinhole array layer PHL may be disposed to overlap with the one or more sensing areas SA. In other words, the sensing areas SA of the display device 10 may be defined in correspondence with the disposition state of the pinhole array layer PHL.

However, the technical spirit of the inventive concept is not limited thereto. In other words, the pinhole array layer PHL may be disposed on the entirety of the display area AA of the display panel 110.

The pinhole array layer PHL is disposed between the light emitting element layer LDL and the sensor layer 120 and configured to selectively transmit incident light therethrough. By causing light to pass through the pinhole array layer PHL before reaching the sensor layer 120, the display device may improve the accuracy of the fingerprint detection. Each pinhole in the pinhole layer may pass light to the sensor layer 120 from a particular field of view, which can be controlled by modifying the design of the pinhole array layer PHL. Furthermore, a bias voltage may be selectively applied to portions of the pinhole array layer, which may cause the pixels PXL corresponding to those portions to have an increased luminance. This may further improve the accuracy of the fingerprint detection without impacting the display quality of the entire display area AA.

In detail, as illustrated in FIGS. 7A and 7B, the pinhole array layer PHL may be formed of a light blocking mask LBM having a plurality of pinholes PIH. In some examples, each pinhole PIH may be configured to project a sub-image corresponding to specific respective portion of the display area AA onto the photo sensors PHS.

The light blocking mask LBM may be formed of an opaque metal layer which is locally open in portions thereof in which the respective pinholes PM are formed. However, the material of the light blocking mask LBM is not limited to metal, and the light blocking mask LBM may be formed of various materials capable of blocking transmission of light. For example, the light blocking mask LBM may be formed of a black matrix material. In exemplary embodiments, the light blocking mask LBM may be rigid or flexible.

The pinholes PIH may form openings which are distributed in the light blocking mask LBM. In other words, the pinhole array layer PHL may include a plurality of pinholes PIH which have identical or different sizes and are regularly or irregularly disposed in the light blocking mask LBM at positions spaced apart from each other at identical or different intervals.

The pinholes PHL may be formed to have appropriate sizes and intervals to prevent diffraction of incident light and more clearly sense the shape of the fingerprint of the user. For example, the width of each pin hole PIH may be set to a value which is ten times or more the wavelength of incident light so as to prevent diffraction of the light. For example, the width of the pinhole PIH may range from 2 μm to 15 μm.

Furthermore, the pitch between the pinholes PIH may be determined based on the distance between the pinhole array layer PHL and the sensor layer 120, the wavelength of incident light, and a field of view (FOV) required for each pinhole PIH. In exemplary embodiments, the angle of the FOV of the pinhole PIH may approximately range from 30° to 60°, e.g., 45°, but it is not limited thereto. In an exemplary embodiment, when the angle of the FOV is approximately 45°, the pitch between the pinholes PIH may be set to a value two or more times the distance between the pinhole array layer PHL and the sensor layer 120, or may be set to or above a value obtained by adding a predetermined error range to the distance. For example, each pinhole PHI may have a width (or a diameter in the case of a circular shape) ranging from approximately 5 μm to approximately 1.5 μm along a first direction (e.g., a horizontal direction) and/or a second direction (e.g., a vertical direction) perpendicular to the first direction.

However, the technical spirit of the inventive concept is not limited thereto, and the size, the shape, the number, the resolution, and the arrangement of the pinholes PIH may be modified in various ways. For example, in exemplary embodiments of the inventive concept, the pinholes PIH may be disposed in the light blocking mask LBM in an irregular pattern. Furthermore, the size of each pinhole PIH may be changed depending on various factors such as a wavelength bandwidth of light to be used to sense the fingerprint and the thickness of each of the layers constituting the display device 10. In exemplary embodiments of the inventive concept, the pinhole array layer PHL may be formed of a plurality of light blocking patterns A (which may be referred to as "light blocking areas"), as illustrated in FIGS. 7A and 7B.

In an exemplary embodiment, as illustrated in FIG. 7A, the pinhole array layer PHL may be thrilled of a plurality of light blocking patterns A arranged in a first direction DR1. For example, the light blocking patterns A of the pinhole array layer PHL may be disposed to respectively correspond to at least some of a plurality of pixel rows provided on the display panel 110.

In an exemplary embodiment, as illustrated in FIG. 7B, the pinhole array layer PHL may be formed of a plurality of light blocking patterns A arranged in a second direction DR2. For example, the light blocking patterns A of the pinhole array layer PHL may be disposed to respectively correspond to at least some of a plurality of pixel columns provided on the display panel 110. In the above-mentioned exemplary embodiments, a light blocking metal pattern capable of blocking light transmission may be formed over gaps G defined between the light blocking patterns A. The metal pattern may include lines for supplying driving signals or power (driving power, initialization power, etc.) to the pixels PXL, for example, including scan lines for supplying scan signals to the pixels PXL, emission control lines for supplying emission control signals to the pixels PXL, data lines for supplying data signals to the pixels PXL, and power lines for applying the driving power to the pixels PXL.

Exemplary embodiments in which the metal pattern is disposed over the gaps G between the light blocking patterns A of the pinhole array layer PHL will be described in more detail later with reference to FIGS. 10 to 14.

Although FIGS. 7A and 7B illustrate the examples where each light blocking pattern A of the pinhole array layer PHL includes one pinhole row or one pinhole column, the technical spirit of the inventive concept is not limited thereto. In exemplary embodiments of the inventive concept, two or more pinhole rows and/or two or more pinhole columns may be formed in each light blocking pattern A of the pinhole array layer PHL.

Furthermore, although FIGS. 7A and 7B illustrate the examples where pinholes PIH having the same size and shape are regularly arranged in each light blocking pattern A of the pinhole array layer PHL, the technical spirit of the inventive concept is not limited thereto. In exemplary embodiments, a plurality of pinholes PIH may be regularly or irregularly arranged in each light blocking pattern A of the pinhole array layer PHL. In these exemplary embodiments, the plurality of pinholes PIH may have identical or different surface areas and/or shapes.

Due to the pinhole array layer PHL having the above-mentioned structure, some of light that is incident on the pinhole array layer PHL may be blocked by the light blocking mask LBM, and the other light may pass through the pinholes PIH and reach the sensor layer 120 disposed under the pinhole array layer PHL. In exemplary embodiments of the inventive concept, light that is incident on the pinhole array layer PHL may be light rays (hereinafter, referred to as "reflected light rays") which are reflected by an object, e.g., the finger, placed on the display device 10. In other words, reflected light rays which are emitted from the pixels PXL (in more detail, the light emitting elements LD of the pixels PXL) and reflected by the finger of the user may be incident on the pinhole array layer PHL. Among the incident reflected light rays, some reflected light rays that have reached the light blocking mask LBM may be blocked by the light blocking mask LBM, and only some reflected light rays that have been incident on the pinholes PIH may pass through the pinholes PHI and reach the sensor layer 120. Although not illustrated in these drawings, in exemplary embodiments of the inventive concept, an insulating layer (illustrated in FIGS. 11, 13, 17, and 19) may be further provided on each of the opposite surfaces of the pinhole array layer PHL. The insulating layer may be provided to prevent impurities from diffusing on the pinhole arrays layer PHL and may have a single- or multi-layer structure. In the case where the insulating layer has a multi-layer structure, the multi-layers of the insulating layer may be formed of identical or different materials.

In exemplary embodiments of the inventive concept, the pinhole array layer FHL may receive a bias voltage through a power line (not illustrated). If the bias voltage is applied to the pinhole array layer PHL, electrical characteristics of at least one circuit element, e.g., transistors, disposed on the circuit element layer BPL may change.

Referring to FIG. 8 (and FIG. 4 illustrating the pixel circuit), a graph shows a vertical axis representing current (Ids) flowing to a light emitting element ID, and a horizontal axis representing a bias voltage (Vg) at the pinhole array layer PHL.

When a negative bias voltage is applied to the pinhole array layer PHL, the threshold voltage of the first transistor T1 disposed on the circuit element layer BPL may be increased by a field effect of the pinhole array layer PHL. Consequently, the current (Ids) flowing to the light emitting element LD may be reduced (within a certain range of the bias voltage). In contrast, when a positive bias voltage is applied to the pinhole array layer the threshold voltage of the first transistor T1 may be reduced. Consequently, the current (Ids) flowing to the light emitting element LD may be increased.

If the current flowing to the light emitting element LD is increased, the quantity of light emitted from the light emitting element LD may be increased. If the quantity of light emitted from the light emitting element LD is increased, the intensity of reflected light rays that are incident on the pinhole array layer PHL may be increased. Consequently, the intensity of light that passes through the pinholes PIH and reaches the sensor layer 120 may also be increased. Hence, the quantity of light having characteristics, based on which the photo sensors PHS disposed on the sensor layer 120 output sensing signals, may be increased. The accuracy of fingerprint sensing based on the sensing signals may be enhanced.

However, a change in quantity of light in each pixel PPL may reduce the quality of an image disposed on the display panel 110. Therefore, in exemplary embodiments of the inventive concept, in the case where the pinhole array layer PHL is formed of a plurality of light blocking patterns A, a bias voltage may be applied to only some light blocking patterns A to be substantially involved in fingerprint sensing.

As described above, in the case where the pinhole array layer PHL is integrally provided in the display panel 110, the thickness of a module of the display device 10 may be reduced. However, in some exemplary embodiments, the pinhole array layer PHL may be separately provided under the display panel 110 rather than being integrally provided with the display panel 110. In these exemplary embodiments the pinhole array layer PHL may be attached to a lower surface of the display panel 110 by an adhesive or the like.

In an additional exemplary embodiment of the inventive concept, the display panel 110 may be transparent on areas thereof in which the pinholes PM are disposed, so as to allow reflected light rays to pass through the corresponding pinholes PIH. In detail, the display panel 110 may be transparent at positions corresponding to the pinholes and respective peripheral areas of the pinholes PIH so as to satisfy the required FOV of each pinhole PIH.

The sensor layer 120 may be provided on one surfiice of the display panel 110 such that the sensor layer 120 overlaps with at least a portion of the display panel 110. For example, the sensor layer 120 may disposed to overlap with the sensing area SA of the display panel 110.

As illustrated in FIG. 6, the sensor layer 120 may be provided on a lower surface (e.g., a surface opposite to the surface on which an image is displayed) of the display panel 110, For example, the sensor layer 120 may be implemented as a sensor IC which is attached to the lower surface of the display panel 110. In an exemplary embodiment where the sensor layer 120 is provided on the lower surface of the display panel 110, the image quality of the display device 10 may be prevented from deteriorating due to the sensor layer 120.

The sensor layer 120 may include a plurality of photo sensors PHS disposed at a predetermined resolution (density, pitch). As described with reference to FIGS. 3A to 3E, the photo sensors PHS may have various sizes, numbers, resolutions, and arrangements relative to the pixels PXL in the display panel 110.

The photo sensors PHS may output, as sensing signals, electrical signals corresponding to reflected light rays that are received after passing through the pinholes Pin Reflected light rays that are received by the photo sensors P1-IS may have different light characteristics (e.g., frequencies, wavelengths, and intensities) depending on whether the reflected light rays are formed by the valleys of the fingerprint of the user or formed by the ridges of the fingerprint. Therefore, the photo sensors may output sensing signals having different electrical characteristics corresponding to the light characteristics of the reflected light rays. The sensing signals output from the photo sensors PHS may be converted into image data and used to identify the fingerprint of the user (i.e., to detect the fingerprint minutiae and relationships among them).

The window 130 may be a protective member which is disposed on the uppermost surface of the display device 10 including the display panel 110, and may be a substantially transparent light transmitting substrate. The window 130 may include a rigid or flexible substrate, and the constituent material of the window 130 is not limited to a specific material.

In addition, in an exemplary embodiment, the display device 10 may further include, e.g., a polarization plate and/or a touch sensor layer (touch electrode layer) although not illustrated. The polarization plate and/or the touch sensor layer may be disposed between the first protective layer PTL1 and the window 130, but it is not limited thereto.

Figure 9:
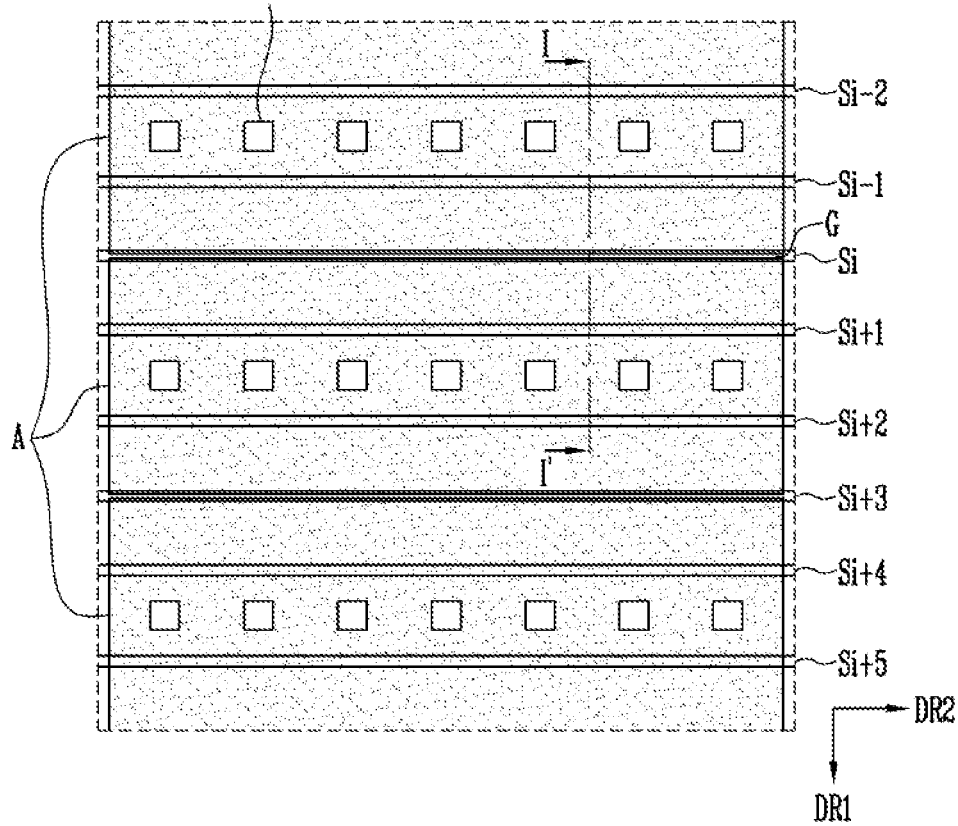
FIG. 9 is an enlarged plan view of an area of the display device illustrated in FIG. 6.
Figure 10:
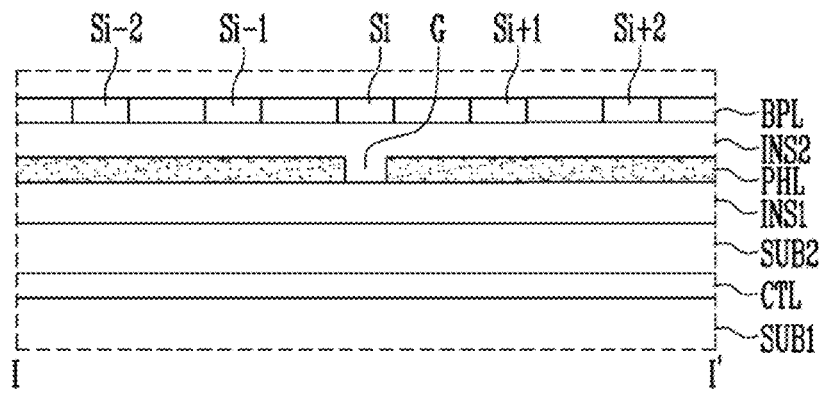
FIG. 10 is a sectional view taken along line I-I' of FIG. 9.

FIG. 9 is an enlarged plan view illustrating an area of the display device illustrated in FIG. 6. FIG. 10 is a sectional view taken along line I-I' of FIG. 9. FIGS. 9 and 10 illustrate a relative arrangement relationship between scan lines Si−2 to Si+5 disposed on the circuit element layer BPL of FIG. 6 and a plurality of light blocking patterns A included in the pinhole array layer PHI.

Referring to FIGS. 9 and 10 along with FIGS. 1 to 8, the display device 10 may include pixels PXL of the display area AA, and a line unit configured to supply driving signals and/or power to the pixels PXL. In exemplary embodiments, the line unit may include scan lines, data lines, emission control lines, and power lines.

In exemplary embodiments of the inventive concept, the line unit may be made of metal material, for example, Titanium (Ti), Copper (Cu), Molybdenum (Mo), Aluminum (Al), Gold (Au), Chromium (Cr), Titanium Nitride (TiN), Silver (Ag), Platinum (Pt), Palladium (Pd), Nickel (Ni), Tin (Sn), Cobalt (Co), Rhenium (Rh), Iridium (Ir), Iron (Fe), Ruthenium (Ru), Osmium (Os), Manganese (Mn), Tungsten (W), Niobium (Nb), Tantalum (Ta), Bismuth (Bi), Antimony (Sb), Lead (Pb), etc. Besides, various other metals may be used.

Alternatively, the line unit may be made of an alloy such as a Molybdenum Titanium alloy (MoTi) or an Aluminum Nickel Lanthanum (La) alloy (AlNiLa). In an exemplary embodiment, the line unit may have a multi-layer structure. In this exemplary embodiment, the line unit may be formed of conductive material having a multi-layer structure such as Ti/Cu, Ti/Au, Mo/Al/Mo, Indium Tin Oxide (ITO)/Ag/ITO, TiN/Ti/Al/Ti, or TiN/Ti/Cu/Ti.

However, the material that forms the line unit is not limited that described above. In other words, the constituent material of the line unit is not limited to metal. Any material may be used so long as it can provide conductivity enough to smoothly drive the pixels PXL. For example, the line unit may be formed of a conductive polymer or conductive metal oxide, Examples of the conductive polymer may include a polythiophene compound, a polypyrrole compound, a polyaniline compound, a polyacetylene compound, and a polyphenylene compound, and mixtures thereof. For example, among polythiophene compounds, a poly(3,4-ethylenedioxythiophene) polystyrene sulfonate (PEDOT/PSS) compound may be used. Examples of the conductive metal oxide may include ITO, Indium Zinc Oxide (IZO), Aluminum-doped Zinc Oxide (AZO), Indium-Tin-Zinc Oxide (ITZO), Zinc Oxide (ZnO), Tin Dioxide ($SnO_2$), etc.

For the sake of explanation, FIGS. 9 and 10 illustrate only the scan lines Si−2 to Si+5. The scan lines Si−2 to Si+5 may be disposed on the circuit element layer BPL and extend in a second direction DR2 in the display area AA. In an exemplary embodiment, the scan lines Si−2 to Si+5 may include an i-2-th scan line Si−2 to an i+5-th scan line Si+5 which are successively arranged in a first direction DR1 intersecting with the second direction DR2. The scan lines Si−2 to Si+5 may receive scan signals. For example, the i-1-th scan line Si−1 may receive an scan signal, the i-th scan line Si may receive an i-th scan signal, and the i+1-th scan liu Si+1 may receive an i+1-th scan signal.

Each of the pixels PXL may be formed of a plurality of circuit elements provided in the circuit element layer BPL, and a light emitting element LD provided in the light emitting element layer LDL. The pixels PXL may be supplied with scan signals, data signals, emission control signals, and driving voltages through the line unit provided on the circuit element layer BPL.

The pinhole array layer PHI may be disposed under the circuit element layer BPL. In an exemplary embodiment of the inventive concept, the pinhole array layer PHL may be formed of a plurality of light blocking patterns A arranged in the first direction DRI Each light blocking pattern A may have at least one pinhole PIH. As illustrated in FIG. 9, pinholes PIH may have the same size and may be regularly arranged to form at least one pinhole row. However, the technical spirit of the inventive concept is not limited thereto, and the pinholes PIH may be irregularly arranged in each light blocking pattern A and may have identical or different sizes and/or shapes.

Here, each light blocking pattern A may overlap with at least one of the scan lines Si-1, Si-2, Si-+1, Si+2, Si-+4, and Si-+5, Although FIG. 9 illustrates that one light blocking pattern A overlaps with two scan lines, the technical spirit of the inventive concept is not limited thereto. The number of scan lines that overlap with each light blocking pattern A may be reduced or increased.

In an exemplary embodiment of the inventive concept, each light blocking pattern A may not overlap with the scan lines Si-2 to Si+5. It may be determined whether each light blocking pattern A overlaps with the scan lines Si-2 to Si+5, based on an arrangement relationship between the pixels PXL and the photo sensors PHS, an arrangement relationship between the pixels PXL and the pinholes an arrangement relationship between the photo sensors PHS and the pinholes PIH, the FOVs of the pinholes PIH, the relative sizes between the photo sensors PHS and/or the pixels PXL.

When a fingerprint sensing operation is performed, a bias voltage may be selectively applied to at least one of the plurality of light blocking patterns A. In an exemplary embodiment, the bias voltage may be selectively applied to at least one light emitting pattern A disposed at a position at which a touch of the user is sensed, among the plurality of light blocking patterns A. The touch position of the user may be sensed, by a change in electromagnetic field, a change in pressure, a change in luminance/intensity of ambient light, etc. However, the technical spirit of the inventive concept is not limited to those described above. In exemplary embodiments, the bias voltage may be selectively applied to some of the plurality of light blocking patterns A in correspondence with a specific area preset depending on a use mode or an application.

In exemplary embodiments, the bias voltage may have a positive value. Photo sensors PHS disposed at positions corresponding to at least one light blocking pattern A to which the bias voltage is applied may sense reflected light rays received through the pinholes PIH of the corresponding light blocking pattern A and output sensing signals corresponding thereto.

In an exemplary embodiment illustrated in FIG. 9, scan lines Si and Si+3 may be disposed over gaps U between the light blocking patterns A. In other words, the light blocking patterns A may be arranged such that each of the gaps U between the light blocking patterns A overlaps with any one of the scan lines Si-2 to Si+5, The scan lines Si and Si-+3 that are disposed over the gaps U may block reflected light rays, in lieu of the light blocking mask of the pinhole array layer PHL. Hence, reflected light rays which are incident on the pinhole array layer NIL may be prevented from reaching the sensor layer 120 through the gaps G.

In this exemplary embodiment, the distance (the width of each gap G) between the light blocking patterns A may correspond to the width of the corresponding scan line Si or Si+3. The width of each gap G may be generally equal to or less than the width of the corresponding scan line Si or Si+3 disposed over the gap G. The width of each of the scan lines Si and Si+3 may be greater than that of the corresponding gap G.

Although FIGS. 9 and 10 illustrate an example in which the scan lines Si are disposed over the gaps G between the light blocking patterns A included in the pinhole array layer PHL, the technical spirit of the inventive concept is not limited thereto. In exemplary embodiments, lines, for example, emission control lines, and power lines, which extend on the circuit element layer BPL in the second direction DR2, may be disposed over the gaps G.

Figure 11:
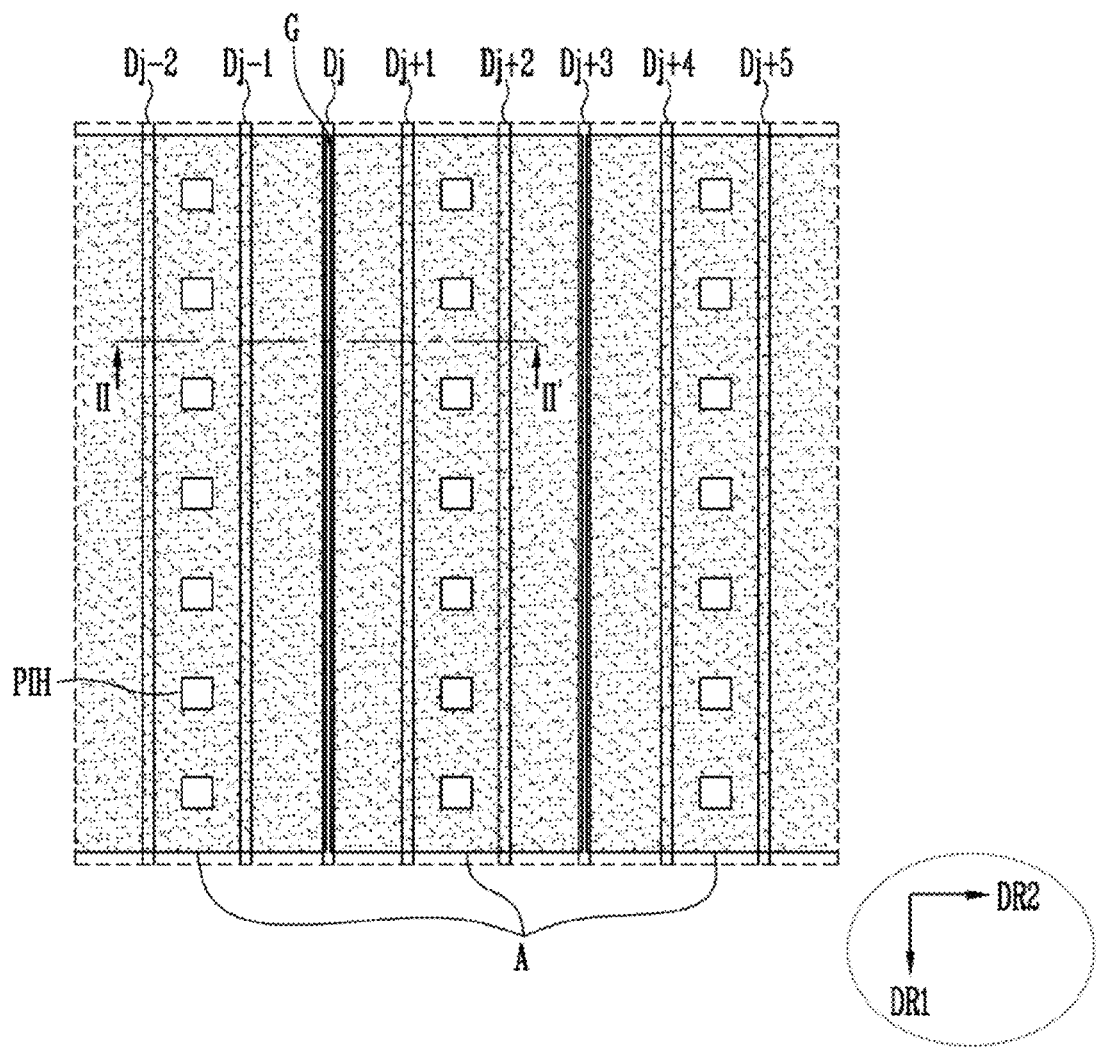
FIG. 11 is an enlarged plan view of an area of the display device illustrated in FIG. 6.
Figure 12:
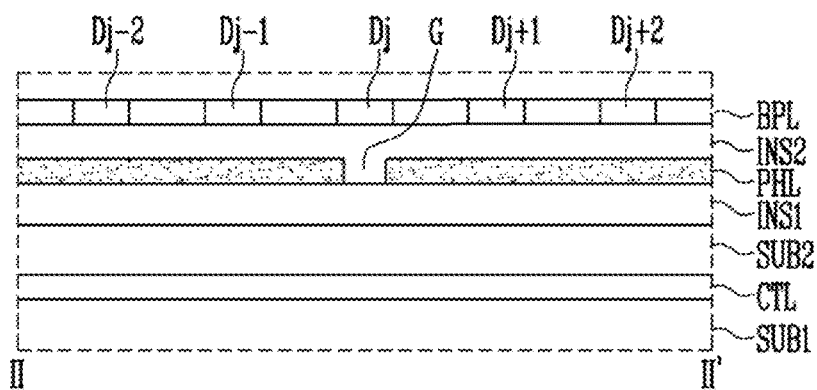
FIG. 12 is a sectional view taken along line II-II' of FIG. 11.

FIG. 11 is an enlarged plan view illustrating an area of the display device 10 illustrated in FIG. 6. FIG. 12 is a sectional view taken along line I-I' of FIG. 11. FIGS. 11 and 12 illustrate a relative arrangement relationship between data lines Dj-2 to Dj+5 disposed on the circuit element layer BPL of FIG. 6 and a plurality of light blocking patterns A included in the pinhole array layer MIL Referring to FIGS. 11 and 12 along with FIGS. 1 to 8, the display device 10 may include pixels PXL of the display area AA, and a line unit configured to supply driving signals and/or power to the pixels PXL. In exemplary embodiments, the line unit may include scan lines, data lines, emission control lines, and power lines.

For the sake of explanation, FIGS. 11 and 12 illustrate only the data lines Dj-2 to Dj+5, The data lines Dj-2 to Dj+5 may be disposed on the circuit element layer BPLand extend in a first direction DR1 in the display area AA. In an exemplary embodiment, the data lines Dj-2 to Di+5 may include a j-2-th data line Dj-2 to a j+5-th data line which are successively arranged in a second direction DR2 intersecting with the first direction DRI. The data lines Dj-2 to Dj+5 may receive data signals. For example, the j-1-th data line Dj-1 may receive j-1-th data signal, the j-th data line Dj may receive a j-th data signal, and the j+1-th data line may receive aj+1-th data signal.

The pinhole array layer PHI, may be disposed under the circuit element layer BPL. In an exemplary embodiment of the inventive concept, the pinhole array layer PHL may be formed of a plurality of light blocking patterns A arranged in the second direction DR2. Each light blocking pattern A may have at least one pinhole PIH. As illustrated in FIG. 12, pinholes PIH may have the same size and be regularly arranged to form at least one pinhole column. However, the technical spirit of the inventive concept is not limited thereto, and the pinholes PIH may be irregularly arranged in each light blocking pattern A and may have identical or different sizes and/or shapes.

Here, each light blocking pattern A may overlap with at least one of the data lines Dj-1, Dj-2, Dj+1, Dj+2, Dj+4, and Dj+5, Although FIG. 11 illustrates that one light blocking pattern A overlaps with two data lines, the technical spirit of the inventive concept is not limited thereto. The number of data lines that overlap with each light blocking pattern A may be reduced or increased.

In an exemplary embodiment of the inventive concept, each light blocking pattern A may not overlap with the data lines Dj-2 to Dj+5. It may be determined whether each light blocking pattern A overlaps with the data lines Dj-2 to Dj+5, based on an arrangement relationship between the pixels PXL and the photo sensors PHS, an arrangement relationship between the pixels PXL and the pinholes an arrangement relationship between the photo sensors PHS and the pinholes PIH, the FOVs of the pinholes PIH, the relative sizes between the photo sensors PHS and/or the pixels PXL.

When a fingerprint sensing operation is performed, a bias voltage may be selectively applied to at least one of the plurality of light blocking patterns A. In an exemplary embodiment, the bias voltage may be selectively applied to at least one light emitting pattern A disposed at a position at which a touch of the user is sensed, among the plurality of light blocking patterns A. The touch position of the user may be sensed, e.g., by a change in electromagnetic field, a change in pressure, a change in luminance/intensity of ambient light, etc. However, the technical spirit of the inventive concept is not limited to those described above. In exemplary embodiments, a bias voltage may be selectively applied to some of the plurality of light blocking patterns A in correspondence with a specific area preset depending on a use mode or an application.

In exemplary embodiments, the bias voltage may have a positive value. Photo sensors PHS disposed at positions corresponding to at least one light blocking pattern A to which the bias voltage is applied may sense reflected light rays received through the pinholes PIH of the corresponding light blocking pattern A and output sensing signals corresponding thereto.

In an exemplary embodiment illustrated in FIG. 11, data lines Dj and Dj+3 may be disposed over gaps G between the light blocking patterns A. In other words, the light blocking patterns A may be arranged such that each of the gaps G between the light blocking patterns A overlaps with any one of the data lines Dj-2 to Dj+5. The data lines D and Dj+3 that are disposed over the gaps G may block reflected light rays, in lieu of the light blocking mask of the pinhole array layer PHL. Hence, reflected light rays may be prevented from reaching the sensor layer 120 through the gaps G.

In this exemplary embodiment, the distance (the width of each gap G) between the light blocking patterns A may correspond to the width of the corresponding data line Dj or Dj+3. The width of each gap G may be generally equal to or less than the width of the corresponding data line Dj or Dj+3 disposed over the gap G. The width of each of the data lines Dj and Dj+3 may be greater than that of the corresponding gap G.

Although FIGS. 11 and 12 illustrate an example in which the data lines Dj are disposed over the gaps G between the light blocking patterns A included in the pinhole array layer PHL, the technical spirit of the inventive concept is not limited thereto. In exemplary embodiments, lines, for example, power lines, which extend on the circuit element layer BPL, in the second direction DR2, may be disposed over the gaps G.

Figure 13:
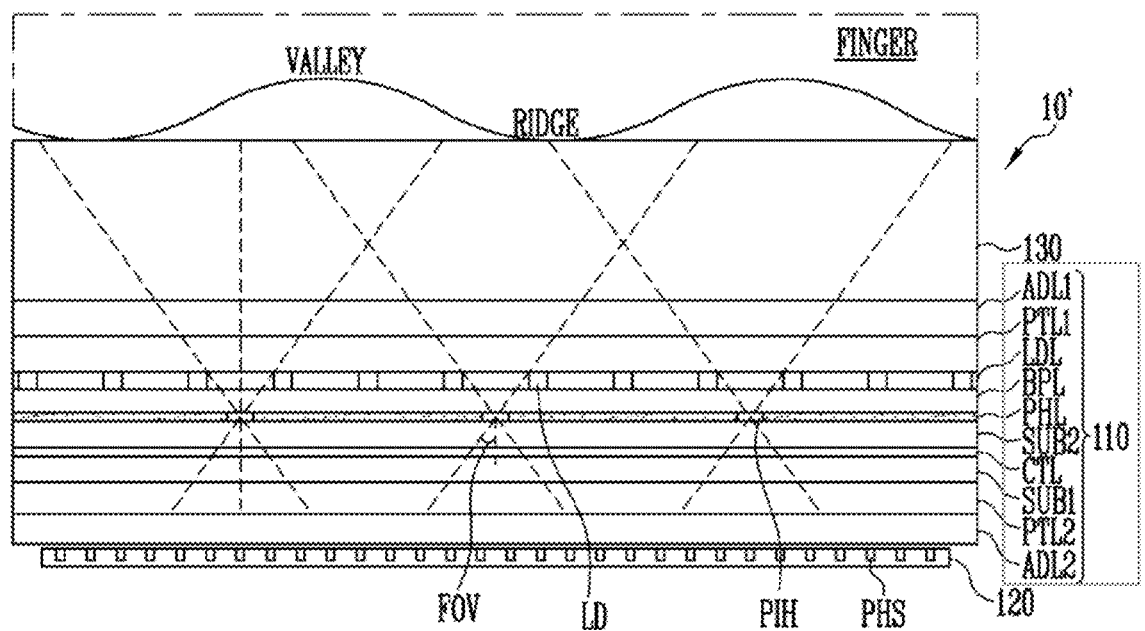
FIG. 13 is a sectional view illustrating a display device in accordance with an exemplary embodiment of the inventive concept.
Figure 14:
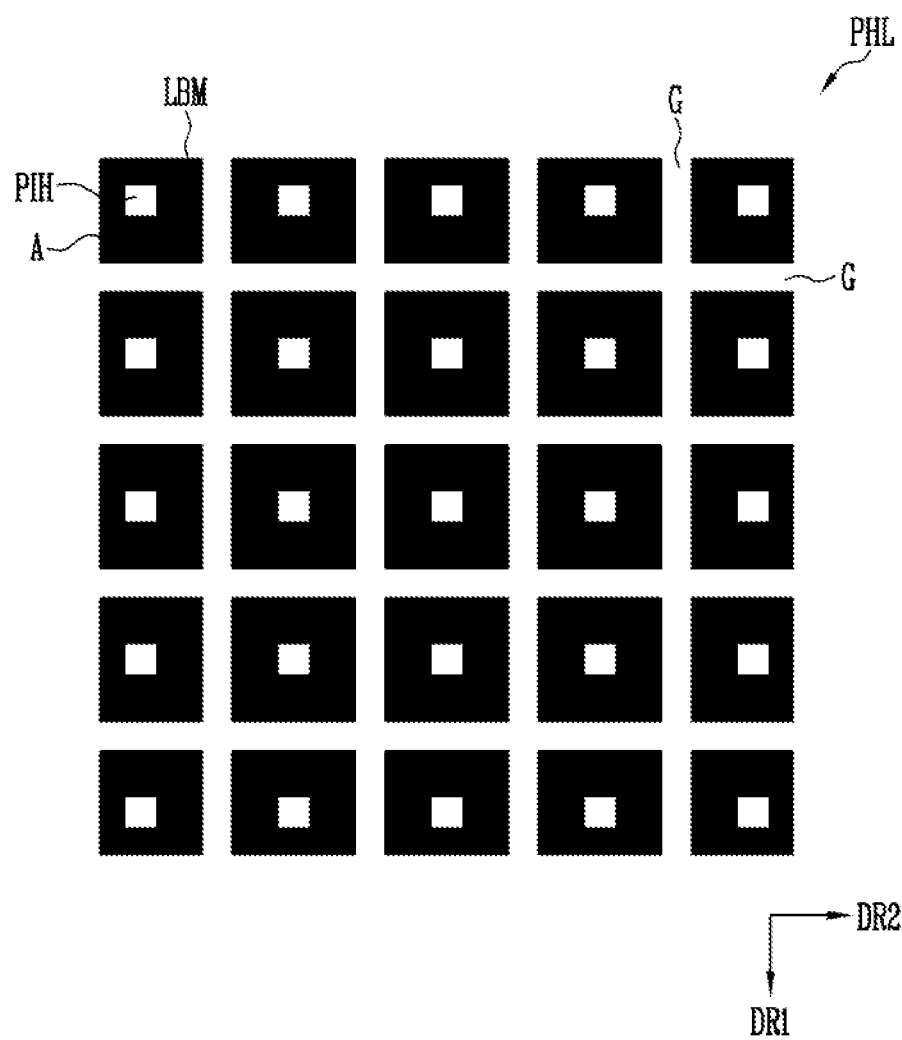
FIG. 14 is a plan view illustrating an exemplary embodiment of a pinhole array layer of FIG. 13.

FIG. 13 is a sectional view of a display device 10' in accordance with an exemplary embodiment of the inventive concept. FIG. 14 is a plan view illustrating an exemplary embodiment of the pinhole array layer PHL of FIG. 13.

Compared to the display device 10 of FIG. 6, the display device 10' other than further including a contact layer CTL is substantially the same as the display device 10 of FIG. 6. Therefore, the same reference numerals will now be used to designate the same components as those of the display device 10 of FIG. 6, and detailed explanation thereof will be omitted.

Referring to FIG. 13, the display device 10' in accordance with an exemplary embodiment of the inventive concept may further include a contact layer CTL. In an exemplary embodiment, the contact layer CTL may be disposed to overlap with the sensing area SA. However, the technical spirit of the inventive concept is not limited thereto. In other words, the contact layer CTL may be disposed on the entirety of the display area AA of the display panel 110.

The contact layer CTL may be disposed under the pinhole array layer PHI, and may be made of conductive material such as Ti, Cu, Mo, Al, Au, Cr, TiN, Ag, Pt, Pd, Ni, Sn, Co, Rh, ir, Fe, Ru, Os, Mn, W, Nb, Ta, Bi, Sb, or Pb. Alternatively the contact layer CTL may be formed of an alloy such as MoT1 or AlNiLa. In this exemplary embodiment, the contact layer CTL may have a multi-layer structure. For example, the contact layer CTL may be made of conductive material having a multi-layer structure such as Ti/Cu, Ti/Au, Mo/Al/Mo, ITO/Ag/ITO, TiN/Ti/Al/Ti, or TiN/Ti/Cu/Ti.

However, the material that forms the contact layer CTL is not limited that described above. In other words, the constituent material of the contact layer CTL is not limited to metal. Any material may be used so long as it can provide conductivity enough to smoothly drive the pinhole array layer PHL. For example, the contact layer CTL may be formed of a conductive polymer or conductive metal oxide, Examples of the conductive polymer may include a polythiophene compound, polypyrrole compound, a polyani line compound, a polyacetylene compound, a polyphenylene compound, and mixtures thereof. For example, a PEDOT/PSS compound of the polythiophene compound may be used. Examples of the conductive metal oxide may include ITO, IZO, AZO, ITZO, ZnO, SnO2, etc.

The contact layer CTL may be electrically coupled, at at least a portion thereof, with the light blocking patterns A of the pinhole array layer PHI, through contact holes CT or the like. Therefore, a voltage supplied to the contact layer CTL may be applied to the pinhole array layer PEEL as a bias voltage.

In an exemplary embodiment, as illustrated in FIG. 14, the pinhole array layer PHL may be formed of a plurality of light blocking patterns A arranged in a first direction DR1 and a second direction DR2. For example, the light blocking patterns A of the pinhole array layer PHL may be disposed to respectively correspond to at least some of a plurality of pixel rows provided on the display panel 110 and at least some of a plurality of pixel rows provided on the display panel 110, The contact layer CTL may be configured such that a bias voltage is applied to only sonic light blocking patterns A to be substantially involved in fingerprint sensing.

In the above-mentioned exemplary embodiments, a light blocking metal pattern capable of blocking light transmission may be formed over gaps S defined between the light blocking patterns A. The metal pattern may be at least a portion of the contact layer CTL. Alternatively, the metal pattern may be a line such as a power line configured to supply power (driving power or initialization power) to the pixels PXL.

Exemplary embodiments in which the metal pattern is disposed over the gaps S between the light blocking patterns A of the pinhole array layer NIL will be described in more detail later with reference to FIGS. 15 and 16.

Although FIG. 14 illustrates an example in which each light blocking pattern A of the pinhole array layer PHL includes only one pinhole, the technical spirit of the inventive concept is not limited thereto. For example, each light blocking pattern A may include a plurality of pinholes.

A second substrate SUB2 may be further provided between the contact layer CTL and the pinhole array layer PHL. The second substrate SUB2 may be a substantially transparent light transmitting substrate, for example, a thin film substrate made of polyimide PI. In an exemplary embodiment, the second substrate SUB2 may be formed of a rigid substrate including glass or tempered glass, or a flexible substrate made of plastic. However, the material of the second substrate SUB2 is not limited thereto, and the second substrate SUB2 may be formed of various materials, FIG. 15 is an enlarged plan view illustrating an area of the display device 10' illustrated in FIG. 13. FIG. 16 is a sectional view taken along line III-III' of FIG. 15, FIGS. 15 and 16 illustrate a relative arrangement relationship between scan lines Si-2 to Si+5 disposed on the circuit element layer BPL of FIG. 13, a plurality of patterns CTL_P1, CTL_P2, CTL_P3, CTL_P4, CTL_P5, and CTL_P6 included in the contact layer CTL, and a plurality of light blocking patterns A included in the pinhole array layer PHL.

Figure 15:
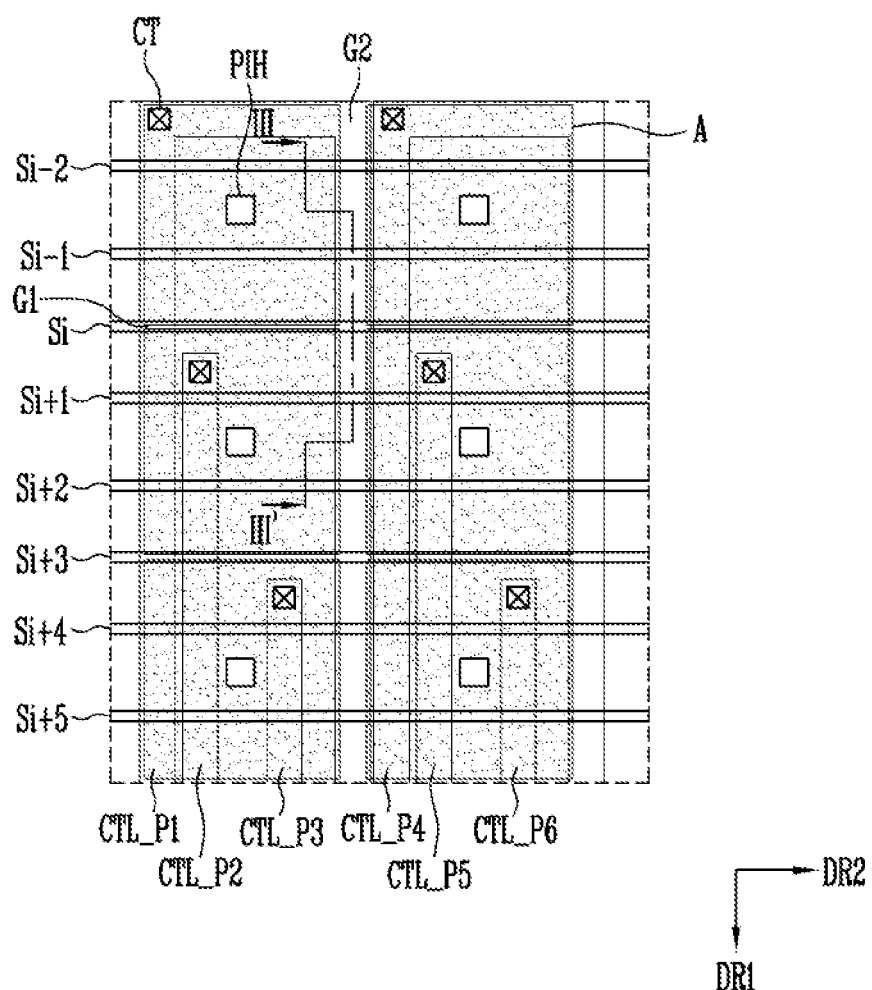
FIG. 15 is an enlarged plan view of an area of the display device illustrated in FIG. 13.
Figure 16:
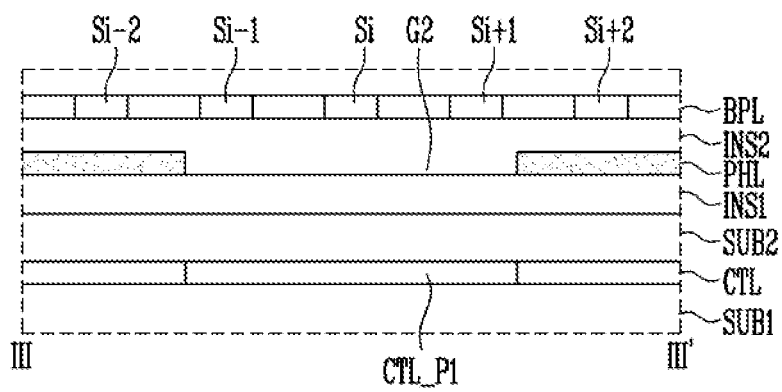
FIG. 16 is a sectional view taken along line III-III' of FIG. 15.

Referring to FIGS. 15 and 16 along with FIGS. 1, to 5, 13, and 14, the display device 10' may include pixels PXL of the display area AA, and a line unit configured to supply driving signals and/or power to the pixels PXL. In exemplary embodiments, the line unit may include scan lines, data lines, emission control lines, and power lines. For the sake of explanation, FIGS. 15 and 16 illustrate only the scan lines Si-2 to Si+5.

The pinhole array layer PHL may be disposed under the circuit element layer BPL. In an exemplary embodiment of the inventive concept, the pinhole array layer PHL may be formed of a plurality of light blocking patterns A arranged in the first direction illi and the second direction DR2. The light blocking patterns A may be arranged in the form of an M×N matrix (M and N are natural numbers of 2 or more).

Each light blocking pattern A may have at least one pinhole PIH. FIG. 15 illustrates an example in which each light blocking pattern A includes one pinhole PIH having the same size and shape. However, the technical spirit of the inventive concept is not limited thereto, and a plurality of pinholes PIH may be regularly or irregularly arranged in each light blocking pattern A, and may have identical or different sizes and/or shapes.

Here, each light blocking pattern A may overlap with at least one of the is scan lines Si-1, Si-2, Si+1, Si+2, Si+4, and Si+5 Although FIG. 14 illustrates that one light blocking pattern A overlaps with two scan lines, the technical spirit of the inventive concept is not limited thereto. The number of scan lines that overlap with each light blocking pattern A may be reduced or increased.

The contact layer CTL is disposed under the pinhole array layer PHL. In exemplary embodiments of the inventive concept, the contact layer CTL may be formed of a plurality of patterns CTL_P1, CTL_P2, CTL_P3, CTL_P4, CTL_P5, and CTL_P6. The patterns CTL_P1, CTL_P2, CTL_P3, CTL_P4, CTL_P5, and CTL_P6 may be respectively coupled to a plurality of light blocking patterns A included in the pinhole array layer PHL through the contact hole CT or the like.

The contact layer CTL may receive a voltage from an external device and transmit the voltage to the light blocking patterns A of the pinhole array layer PHIL as a bias voltage. If a voltage is applied to any one of die patterns CTL_P1, CTL_P2, CTL_P3, CTL_P4, CTL_P5, and CTL_P6 of the contact layer CTL, a bias voltage may be selectively applied to a corresponding light blocking pattern A among the plurality of light blocking patterns A included in the pinhole array layer PHI.

In exemplary embodiments, the bias voltage may have a positive value. Photo sensors PHS disposed at positions corresponding to at least one light blocking pattern A to which the bias voltage is applied may sense reflected light rays received through the pinholes PHI of the corresponding light blocking pattern A and output sensing signals corresponding thereto.

In an exemplary embodiment illustrated in FIG. 15, the pinhole array layer PHL may include first gaps G1 defined between the light blocking patterns A that are arranged in the first direction DR1, and second gaps G2 defined between the light blocking patterns A that are arranged in the second direction DR2. In this exemplary embodiment, the scan lines Si and Si+3 may be disposed over the first gaps G1. In other words, each of the gaps G may be arranged to overlap with any one of the scan lines Si-2 to Si+5.

Furthermore, in an exemplary embodiment illustrated in FIG. 15, the second gaps G2 may be arranged to overlap with at least some CTL_P1 and CTL_P4 of the patterns of the contact layer CTL. In this exemplary embodiment, the width of each second gap G2 may correspond to the width of each of the patterns CTL_P1, CTL_P2, CTL_P3, CTL_P4, CTL_P5, and CTL_P6 of the contact layer CTL. In other words, the width of each second gap G2 may be equal to or less than the width of each of the patterns CTK_P1 and CTL_P4 of the contact layer CTL that is disposed over the second gap G2.

In lieu of the light blocking mask LBM of the pinhole array layer PHL, the scan lines Si and Si+3 disposed over the first and second gaps G1 and G2, and the patterns CTL_P1 and CTL_P4 of the contact layer CTL may block reflected light rays. Hence, reflected light rays which are incident on the pinhole array layer PHL may be prevented from reaching the sensor layer 120 through the gaps G1 and G2.

Although FIGS. 15 and 16 illustrate an example in which the first and second gaps G1 and G2 of the light blocking patterns A included in the pinhole array layer PHL overlap with the scan line Si and the patterns CTL_P1 and CTL_P4 of the contact layer CTL, the technical spirit of the inventive concept is not limited thereto. In exemplary embodiments, the first gap G1 may overlap with an emission control line or a power line, and/or the second gap G2 may overlap with a data line or a power line.

Although FIGS. 15 and 16 illustrate that each of the second gaps G2 of the light blocking patterns A overlaps with any one of the patterns CTL_P1, CTL_P2, CTL_P3, CTL_P4, CTL_P5, and CTL_P6 of the contact layer CTL configured to apply a bias voltage to the light blocking patterns A, the technical spirit of the inventive concept is not limited thereto. For example, in exemplary embodiments of the inventive concept, the second gaps G2 may overlap with some dummy patterns (e.g., metal patterns) additionally disposed on the contact layer CTL.

Figure 17:
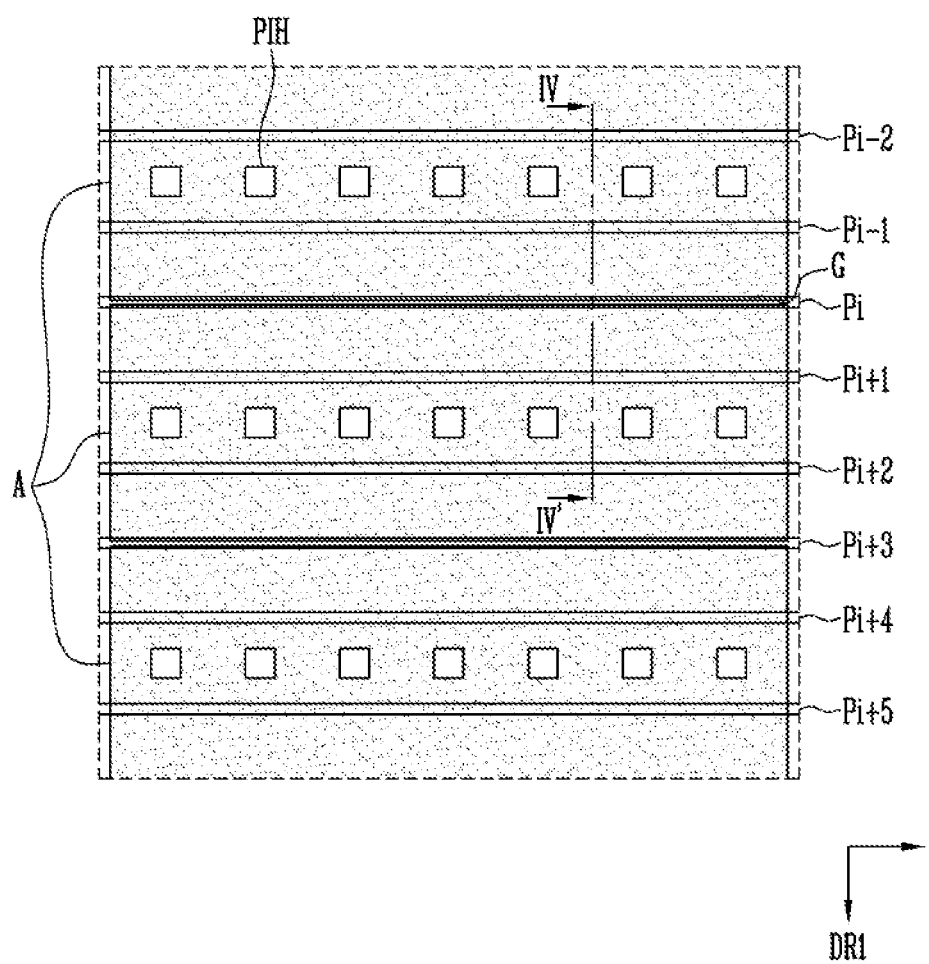
FIG. 17 is an enlarged plan view of an area of a display device in accordance with an exemplary embodiment of the inventive concept.
Figure 18:
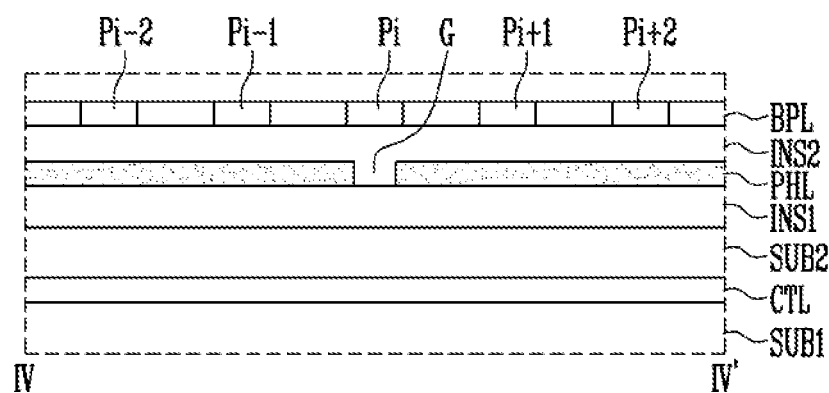
FIG. 18 is a sectional view taken along line IV-IV' of FIG. 16.

FIG. 17 is an enlarged plan view illustrating an area of a display device in accordance with an exemplary embodiment of the inventive concept, FIG. 18 is a sectional view taken along line IV-IV' of FIG. 17.

Unlike the exemplary embodiments of FIGS. 9 to 16, in the display device in accordance with this exemplary embodiment, lines and/or metal patterns Pi and Pi+1 provided separately from the contact layer CTL are disposed over gaps G of a plurality of light blocking patterns A included in the pinhole array layer PHL.

Each of the metal patterns Pi and Pi+1 may have a shape and size corresponding to those of each of the gaps G of a plurality of light blocking patterns A included in the pinhole array layer PHL. In other words, although FIG. 16 illustrates that the plurality of light blocking patterns A have rectangular shapes and the gaps G thus have linear shapes, in exemplary embodiments, the plurality of light blocking patterns A may have various shapes such as circular, elliptical, and polygonal shapes, and the gaps G may have various shapes corresponding to the shapes of the light blocking patterns A, in this exemplary embodiment, each of the metal patterns Pi and Pi+1 may have a shape and a size corresponding to those of the gaps G.

The metal patterns Pi and Pi+1 may be made of conductive material such as Ti, Cu, Mo, Al, Au, Cr, TIN, Ag, Pt, Pd, Ni, Sn, Co, Rh, Ir, Fe, Ru, Os, Mn, W, Nb, Ta, Bi, Sb, or Pb. Alternatively, the metal patterns Pi and Pi+1 may be formed of an alloy such as MoTi or AlNiLa. In this exemplary embodiment, each of the metal patterns Pi and Pi+1 may have a multi-layer structure. For example, each of the metal patterns Pi and Pi+1 may be made of conductive material having a multi-layer structure such as Ti/Cu, Ti/Au, Mo/Al/Mo, TiN/Ti/Al/Ti, or TiN/Ti/Cu/Ti.

The constituent material of the metal patterns Pi and Pi+1 is not limited to the above-mentioned material. For example, each of the metal patterns Pi and Pi+1 may be formed of a conductive polymer or conductive metal oxide. Examples of the conductive polymer may include a polythiophene compound, a polypyrroic compound, a polyaniline compound, a polyacetylene compound, a polyphenylene compound, and mixtures thereof. For example, a PEDOT/PSS compound of the polythiophene compound may be used. Examples of the conductive metal oxide may include ITO, IZO, AZO, ITZO, ZnO, SnO2, etc.

Although FIG. 18 illustrates that the metal patterns Pi and Pi+1 are provided in the circuit element layer BPL, the technical spirit of the inventive concept is not limited thereto. In exemplary embodiments of the inventive concept, the metal patterns Pi and P1+1 may be provided in an arbitrary layer provided over or under the pinhole array layer PHI, or disposed as a separate layer.

The metal patterns Pi and may block reflected light rays in lieu of the light blocking mask LBM of the pinhole array layer PHL. Hence, reflected light rays which are incident on the pinhole array layer PHL may be prevented from reaching the sensor layer 120 through the gaps G.

As described above, in a fingerprint sensor and a display device including the fingerprint sensor in accordance with an exemplary embodiment of the inventive concept, a light emitting element provided in a pixel is used as a light source, and the quantity of the light source may be increased so that the accuracy in fingerprint sensing may be enhanced.

Furthermore, in the fingerprint sensor and the display device including the fingerprint sensor in accordance with an exemplary embodiment of the inventive concept, a pinhole array layer is formed of a plurality of light blocking patterns, and a fingerprint sensing operation using the pinhole array layer may be performed only on a specific light blocking pattern so that the quality of an image on the entirety of the display panel may be prevented from deteriorating, and sensing processing time may be reduced.

While the inventive concept has been shown and described with reference to exemplary embodiments thereof, those of ordinary skill in the art will readily appreciate that modifications in form and details may be made thereto without materially departing from spirit and scope of the inventive concept as set forth by the following claims.

What is claimed is:

1. A display device comprising:
    a display panel including pixels and a light transmitting hole array layer including a plurality of light blocking patterns, each light blocking pattern having a plurality of light transmitting holes and each light blocking pattern corresponding to a respective area of the display panel, wherein the display panel comprises:
        a circuit element layer on which at least one circuit element forming each of the pixels is provided; and
        a contact layer configured to apply power to the light blocking patterns, wherein the contact layer is electrically coupled to the light blocking patterns through one or more contact holes and selectively applies a bias voltage to at least one of the light blocking patterns;
    a sensor layer formed on one surface of the display panel and including a plurality of photo sensors configured to sense light rays that are incident through the display panel; and
    metal patterns configured to apply electrical signals to the pixels or to one or more light blocking patterns of the plurality of light blocking patterns, wherein the metal patterns comprise first metal patterns including lines formed on the circuit element layer and second metal patterns including lines formed on the contact layer,
    wherein a gap between at least two light blocking patterns of the plurality of light blocking patterns overlaps with at least some of the metal patterns.

2. The display device according to claim 1, wherein the metal patterns comprise at least one kind of lines among scan lines configured to supply scan signals to the pixels, data lines configured to supply data signals to the pixels, emission control lines configured to supply emission control signals to the pixels, and power lines configured to apply driving power to the pixels.

3. The display device according to claim 1, wherein the light transmitting hole array layer comprises the plurality of light blocking patterns extending in a first direction and arranged in a second direction perpendicular to the first direction.

4. The display device according to claim 1, wherein the light transmitting hole array layer comprises the plurality of light blocking patterns arranged in a first direction and extending in a second direction perpendicular to the first direction.

5. The display device according to claim 1, wherein first directional gaps of gaps between the light blocking patterns overlap with the first metal patterns, and second directional gaps of the gaps overlap with the second metal patterns.

6. The display device according to claim 1, wherein the metal patterns block light rays that are incident into gaps between the light blocking patterns.

7. A method of fingerprint detection, comprising:
identify a location of a finger placed on or near a display area of a display device;
select a portion of the display area corresponding to the location of the finger; and
apply a bias voltage to one or more patterns of a pinhole array of the display device, wherein the pinhole array comprises a plurality of patterns and the one or more patterns correspond to the selected portion of the display area;
increase a luminance of the portion of the display area based on applying the bias voltage;
block a first portion of reflected light from the finger, wherein the reflected light is based at least in part on the increased luminance, and wherein the first portion of light is blocked using a light blocking pattern aligned with one or more gaps in the patterns of the pinhole array;
sense a second portion of light reflected from the finger using a sensor layer of the display device, wherein the second portion of light passes through pinholes in the one or more patterns of the pinhole array; and
detect a fingerprint based on the second portion of light.

8. A fingerprint sensor comprising:
a light transmitting hole array layer including a plurality of light blocking patterns arranged in a first direction, each of the plurality of light blocking patterns having a plurality of light transmitting holes arranged in a second direction to form light transmitting paths of light rays, wherein the first direction is perpendicular to the second direction;
a sensor layer including a plurality of photo sensors configured to sense light rays that pass through the light transmitting holes and are incident on the sensor layer; and
metal patterns configured to apply electrical signals to pixels or the light blocking patterns,
wherein at least one gap in the first direction between the light blocking patterns arranged in the first direction overlaps with at least some of the metal patterns.

9. The fingerprint sensor according to claim 8, further comprising a circuit element layer on which at least one circuit element that forms each of the pixels is formed,
wherein the metal patterns comprise lines formed on the circuit element layer.

10. The fingerprint sensor according to claim 9, wherein the metal patterns comprise at least one kind of lines among scan lines configured to supply scan signals to the pixels, data lines configured to supply data signals to the pixels, emission control lines configured to supply emission control signals to the pixels, and power lines configured to apply driving power to the pixels.

11. The fingerprint sensor according to claim 8, further comprising a contact layer configured to apply power to the light blocking patterns,
wherein the metal patterns comprise lines formed on the contact layer.

12. The fingerprint sensor according to claim 11, wherein the contact layer is electrically coupled to the light blocking patterns through one or more contact holes and selectively applies a bias voltage to at least one of the light blocking patterns.

13. The fingerprint sensor according to claim 12,
wherein each of the pixels comprises at least one transistor, and
wherein the at least one transistor changes in threshold voltage thereof as the bias voltage is selectively applied to the at least one of the light blocking patterns.

14. The fingerprint sensor according to claim 12,
wherein each of the pixels comprises a light emitting element, and
wherein, as the bias voltage is selectively applied to the at least one of the light blocking patterns, current passing through the light emitting element is controlled.

15. The fingerprint sensor according to claim 12, wherein the bias voltage is a positive voltage.

16. The fingerprint sensor according to claim 8, wherein the first direction and the second direction are parallel to the sensor layer.

17. The fingerprint sensor according to claim 8, further comprising:
a circuit element layer on which at least one circuit element forming each of the pixels is provided; and
a contact layer configured to apply power to the light blocking patterns,
wherein the metal patterns comprise:
first metal patterns including lines formed on the circuit element layer; and
second metal patterns including lines formed on the contact layer.

18. The fingerprint sensor according to claim 17, wherein first directional gaps of gaps between the light blocking patterns overlap with the first metal patterns, and second directional gaps of the gaps overlap with the second metal patterns.

19. The fingerprint sensor according to claim 8, wherein the metal patterns block light rays that are incident into the gaps between the light blocking patterns.

* * * * *